(12) United States Patent
Lee

(10) Patent No.: US 10,468,422 B2
(45) Date of Patent: Nov. 5, 2019

(54) SEMICONDUCTOR DEVICE

(71) Applicant: SK hynix Inc., Icheon-si, Gyeonggi-do (KR)

(72) Inventor: Ki Hong Lee, Suwon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 164 days.

(21) Appl. No.: 15/170,285

(22) Filed: Jun. 1, 2016

(65) Prior Publication Data

US 2017/0207226 A1   Jul. 20, 2017

(30) Foreign Application Priority Data

Jan. 18, 2016 (KR) .................. 10-2016-0006075

(51) Int. Cl.
| H01L 27/115 | (2017.01) |
| H01L 27/11548 | (2017.01) |
| H01L 27/11575 | (2017.01) |
| H01L 27/11529 | (2017.01) |
| H01L 27/11556 | (2017.01) |
| H01L 27/11573 | (2017.01) |
| H01L 27/11582 | (2017.01) |
| H01L 23/522 | (2006.01) |
| H01L 23/528 | (2006.01) |
| H01L 49/02 | (2006.01) |

(52) U.S. Cl.
CPC ........ *H01L 27/115* (2013.01); *H01L 23/5226* (2013.01); *H01L 23/5283* (2013.01); *H01L 27/11529* (2013.01); *H01L 27/11548* (2013.01); *H01L 27/11556* (2013.01); *H01L 27/11573* (2013.01); *H01L 27/11575* (2013.01); *H01L 27/11582* (2013.01); *H01L 28/00* (2013.01)

(58) Field of Classification Search
CPC ......... H01L 27/11582; H01L 27/11556; H01L 27/11578; H01L 27/1158; H01L 27/11553; H01L 27/11551; H01L 27/11529; H01L 27/11573; H01L 27/11575; H01L 27/11548
See application file for complete search history.

(56) References Cited

U.S. PATENT DOCUMENTS

| 9,048,224 B2 * | 6/2015 | Iguchi | H01L 21/28282 |
| 9,318,502 B2 * | 4/2016 | Son | H01L 27/11573 |
| 9,478,495 B1 * | 10/2016 | Pachamuthu | H01L 23/53223 |
| 2014/0061748 A1 * | 3/2014 | Lee | H01L 29/78 257/314 |

(Continued)

FOREIGN PATENT DOCUMENTS

KR   1020160109971 A   9/2016

*Primary Examiner* — Jesse Y Miyoshi
(74) *Attorney, Agent, or Firm* — William Park & Associates Ltd.

(57) ABSTRACT

A semiconductor device may include a source layer, a stack structure, a channel layer, a slit, and a source pick-up line. The source layer may include at least one groove in an upper surface thereof. The stack structure may be formed over the source layer. The channel layer may pass through the stack structure. The channel layer may be in contact with the source layer. The slit may pass through the stack structure. The slit may expose the groove of the source layer therethrough. The source pick-up line may be formed in the slit and the groove. The source pick-up line may be contacted with the source layer.

19 Claims, 21 Drawing Sheets

(56) References Cited

U.S. PATENT DOCUMENTS

| | | | |
|---|---|---|---|
| 2014/0169105 A1* | 6/2014 | Oh | H01L 29/7926 |
| | | | 365/185.29 |
| 2015/0279852 A1* | 10/2015 | Mizutani | H01L 27/11556 |
| | | | 257/315 |
| 2016/0293621 A1* | 10/2016 | Huang | H01L 27/0207 |

* cited by examiner

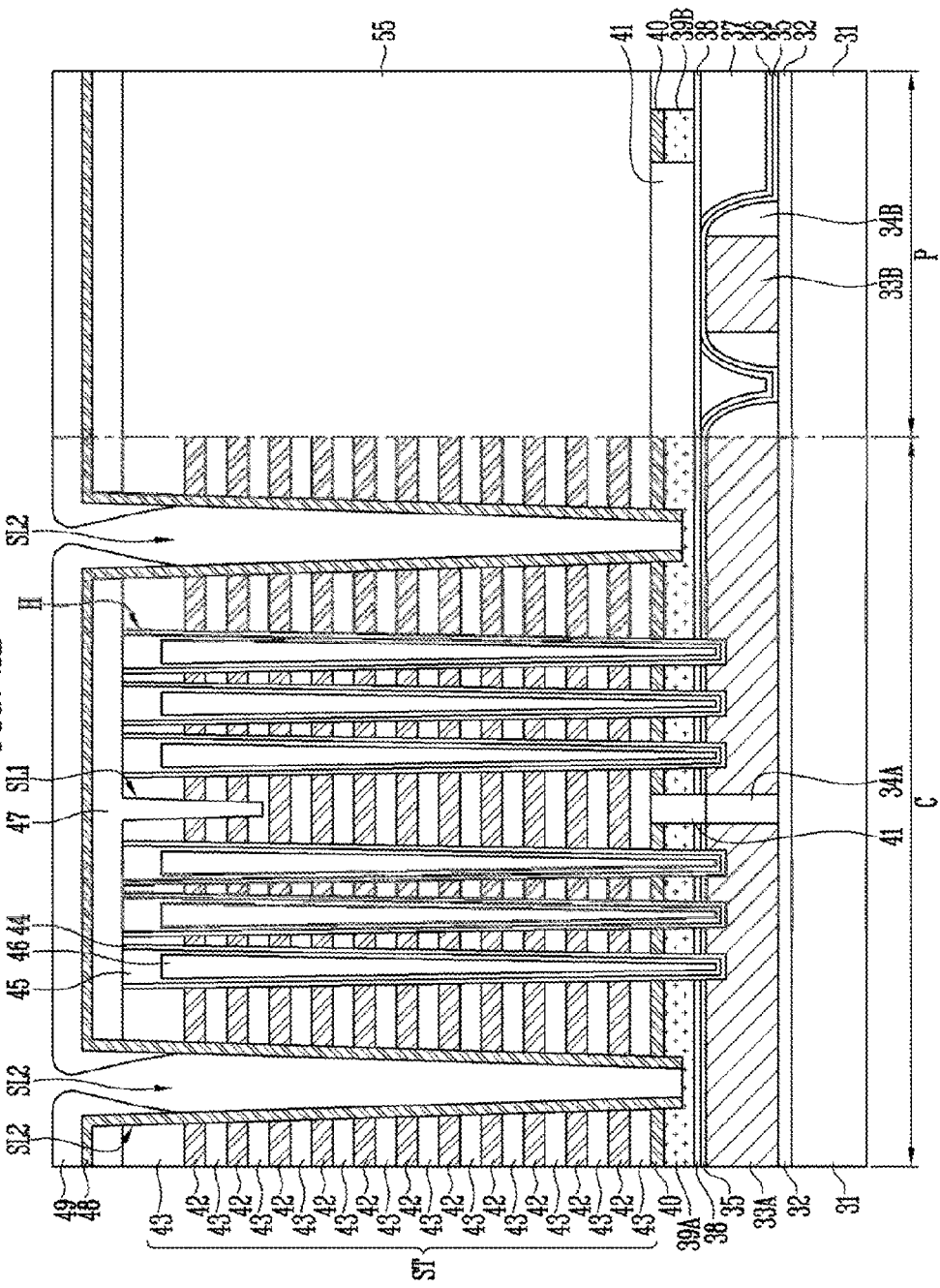

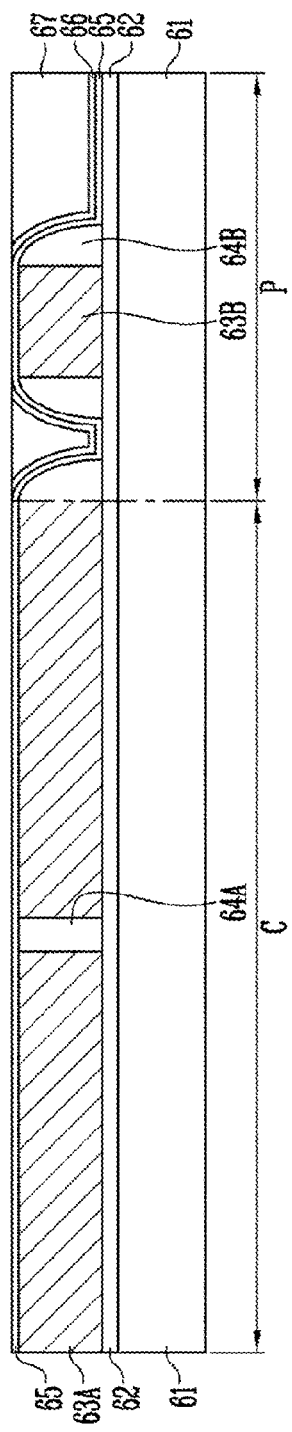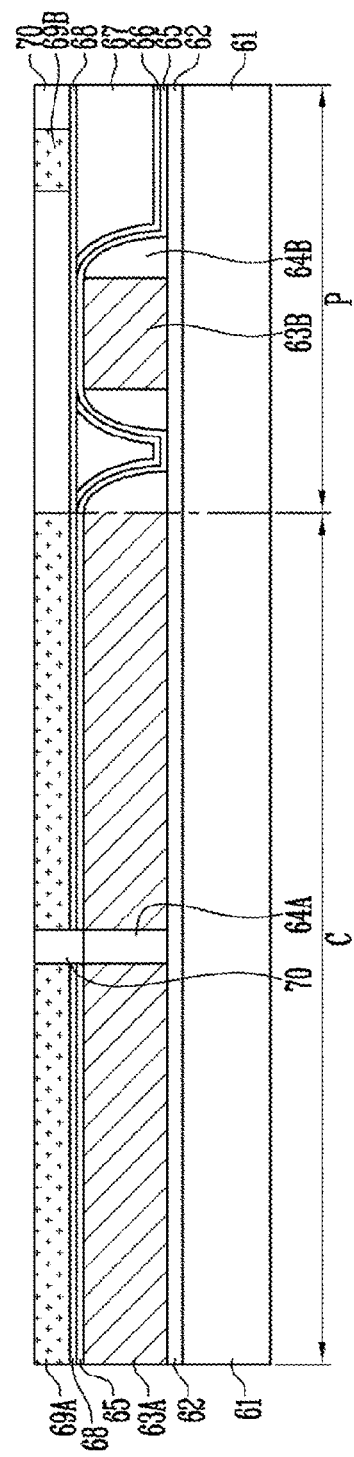

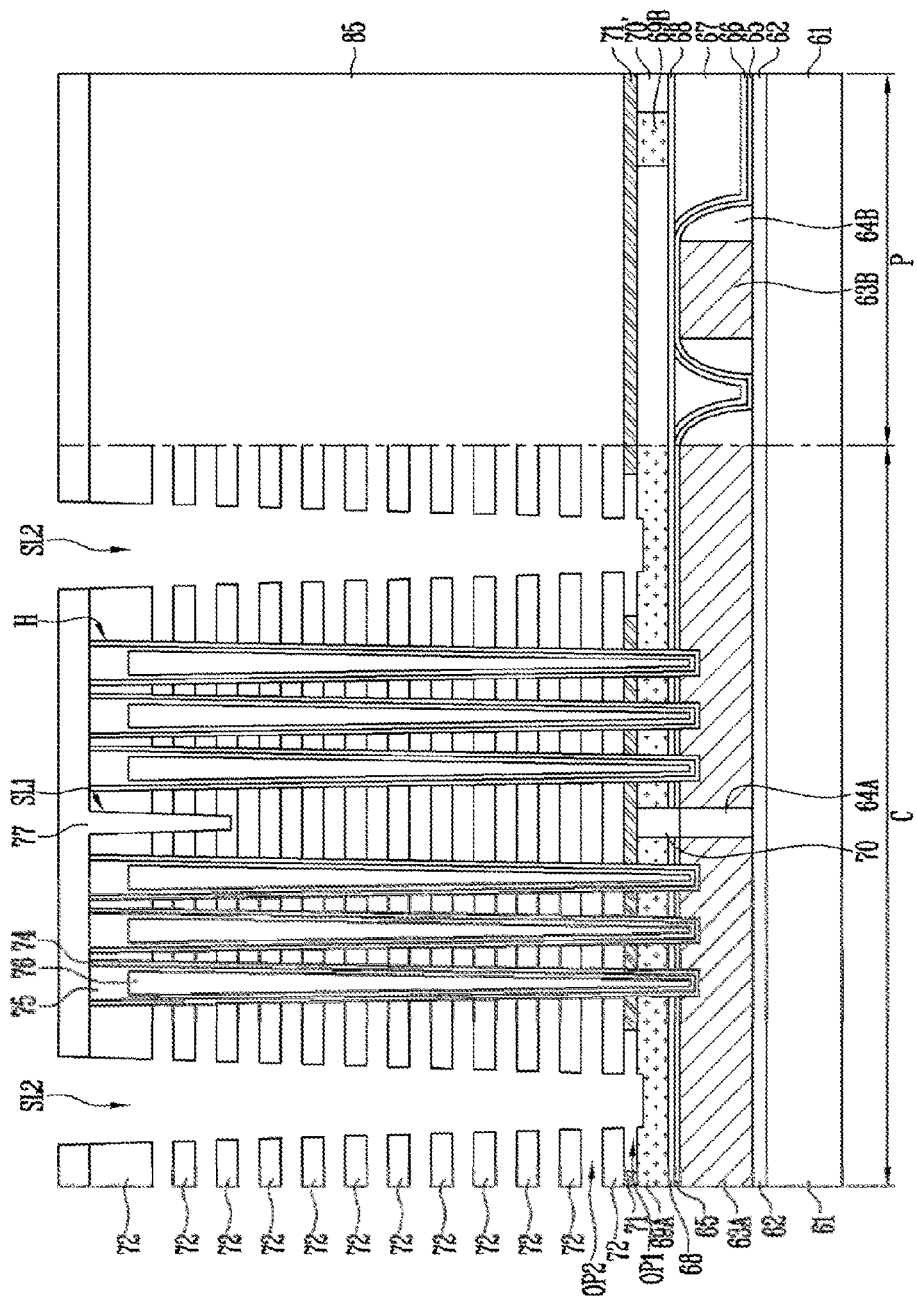

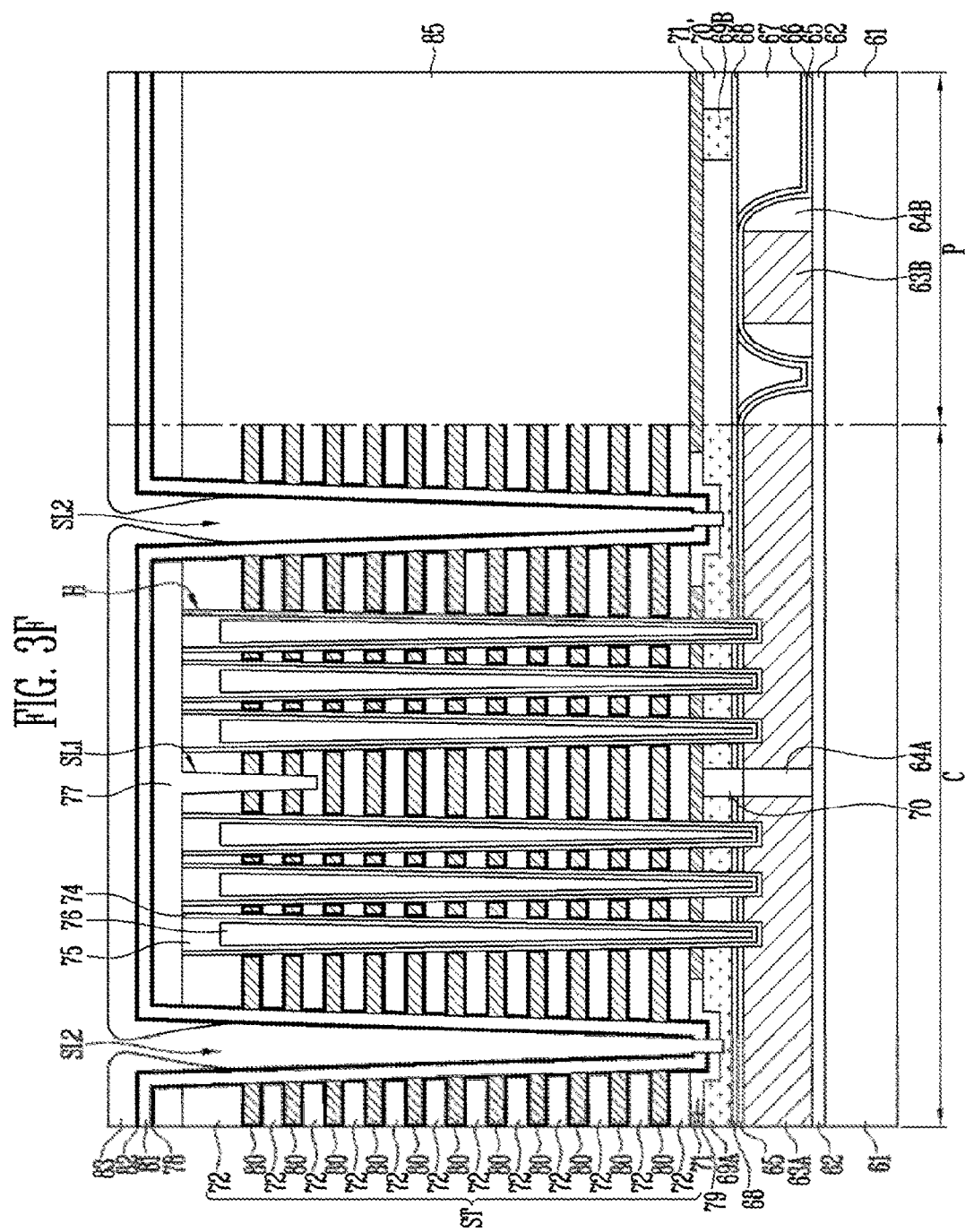

SEMICONDUCTOR DEVICE

CROSS-REFERENCE TO RELATED APPLICATION

The present application claims a priority under 35 U.S.C. § 119(a) to a Korean patent application number 10-2016-0006075 filed on Jan. 18, 2016, in the Korean Intellectual Property Office, the entire disclosure of which is incorporated herein by reference.

BACKGROUND

1. Technical Field

An aspect of the present disclosure generally relates to an electronic device and a manufacturing method thereof, and more particularly to a three-dimensional semiconductor device and a manufacturing method thereof.

2. Related Art

Nonvolatile memory devices are memory devices that retain their stored data even in the absence of a power supply. Traditional two-dimensional nonvolatile memory devices have reached the limits of their memory capacity due to structural and material issues. These limits have increased the interest of the semiconductor industry in a three-dimensional nonvolatile memory device in which memory cells are vertically stacked over a substrate.

In an example of three-dimensional nonvolatile memory device, a stacked structure may be formed by alternately stacking conductive layers and insulating layers, and a channel layer may be formed to pass through the stacked structure, thereby simultaneously forming a plurality of memory cells.

SUMMARY

Embodiments provide a manufacturing method of a semiconductor device that is easily manufactured and has improved characteristics.

According to an aspect of the present disclosure, a semiconductor device may include a source layer, a stack structure, a channel layer, a slit, and a source pick-up line. The source layer may include at least one groove in an upper surface thereof. The stack structure may be formed over the source layer. The channel layer may pass through the stack structure. The channel layer may be in contact with the source layer. The slit may pass through the stack structure. The slit may expose the groove of the source layer therethrough. The source pick-up line may be formed in the slit and the groove. The source pick-up line may be contacted with the source layer.

According to an aspect of the present disclosure, a semiconductor device may include a source layer, a stack structure, a channel layer, a slit, a slit insulating layer. The source layer may include at least one groove in an upper surface thereof. The stack structure may be formed on the source layer. The channel layer may pass through the stack structure. The channel layer may be in contact with the source layer. The slit may pass through the stack structure. The slit may expose the groove of the source layer therethrough. The slit insulating layer may be in contact with the source layer. The slit insulating layer may be formed in the slit and the groove.

According to an aspect of the present disclosure, a method of manufacturing a semiconductor device may include forming a sacrificial layer, alternately forming first material layers and second material layers on the sacrificial layer, forming a semiconductor layer passing through the first and second material layers, forming a slit passing through the first and second material layers, forming a first opening by removing the sacrificial layer through the slit, forming, in the first opening, a first conductive layer in contact with the semiconductor layer, the first conductive layer including a groove abutting a bottom portion of the slit, and forming a second conductive layer in the slit and the groove.

According to an aspect of the present disclosure, a method of manufacturing a semiconductor device may include forming a sacrificial layer, forming a first material layer on the sacrificial layer, alternately forming second material layers and third material layers on the first material layer, forming a semiconductor layer passing through the first to third material layers, forming a slit passing through the first to third material layers, forming a first opening by partially removing the first material layer through the slit, forming second openings by removing the third material layers through the slit, forming first conductive layers in the second openings, and oxidizing the first material layer and the sacrificial layer, which are exposed through the slit and the first opening and forming a protective layer, which is positioned on the sacrificial layer and formed in the first opening.

BRIEF DESCRIPTION OF THE DRAWINGS

FIGS. 2A to 2G are sectional views illustrating an example manufacturing method of a semiconductor device according to an embodiment of the present disclosure.

FIGS. 3A to 3I are sectional views illustrating an example manufacturing method of a semiconductor device according to an embodiment of the present disclosure.

DETAILED DESCRIPTION

Figure 1A:
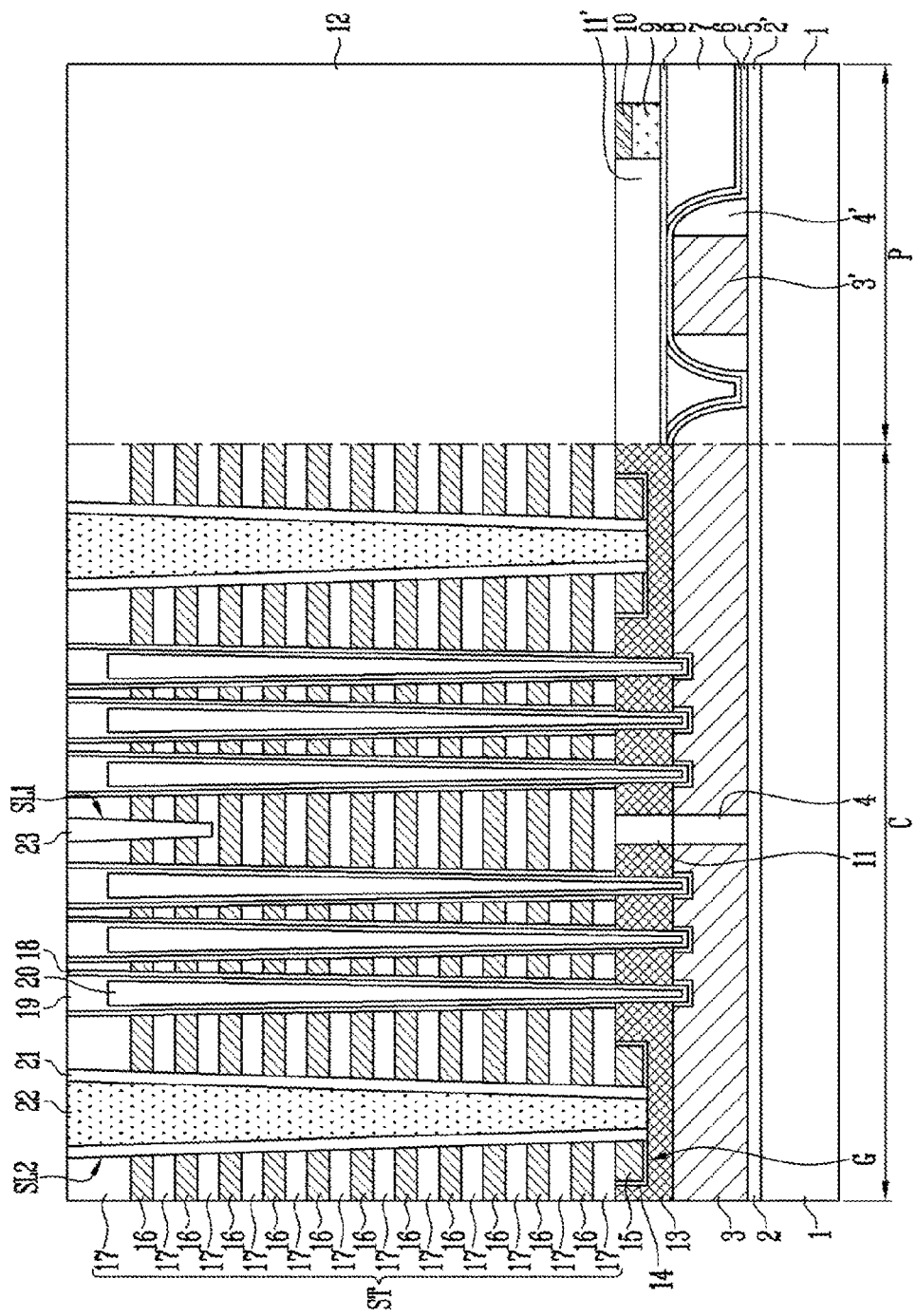
FIGS. 1A to 1D are sectional views illustrating example structures of a semiconductor device according to embodiments of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Example embodiments of the present disclosure will be described with reference to the accompanying drawings.

The example embodiments of the present disclosure may, however, be embodied in many different forms and should not be construed as limited to the example embodiments set forth herein. Rather, the example embodiments are provided so that disclosure of the present disclosure will be thorough and complete, and will fully convey the scope of the present disclosure to those skilled in the art. The features of example embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

FIGS. 1A to 1D are sectional views illustrating example structures of semiconductor devices according to embodiments of the present disclosure.

Referring to FIG. 1A, the semiconductor device according to an embodiment of the present disclosure may include a cell region C in which a cell array is positioned and a peripheral region P in which a driving circuit for driving the cell array is positioned. Here, the cell region C and the peripheral region P may be positioned at the same level over a substrate 1. Alternatively, the cell region C and the peripheral region P may be positioned at different levels from one another. Although it is illustrated that the cell region C and the peripheral region P are positioned at the same level, the peripheral region P may be positioned under or over the cell region C.

First, the cell region C will be described. A first source layer 3 may be positioned in the cell region C of the substrate 1. The first source layer 3 may include a conductive layer, and may be formed of the same material as a gate electrode 3' of a transistor positioned in the peripheral region P. In order to insulate the substrate 1 and the first source layer 3 from each other, a first insulating layer 2 may be interposed between the substrate 1 and the first source layer 3. Here, the first insulating layer 2 may extend up to the peripheral region P to be connected to a gate insulating layer 2' of the transistor. That is, the first insulating layer 2 and the gate insulating layer 2' may be formed as a single layer. Here, the first source layer 3 and the gate electrode 3' may be doped polysilicon layers, and the first insulating layer 2 and the gate insulating layer 2' may be oxide layers.

The first source layer 3 may be separated into a plurality of patterns by a second insulating layer 4. The second insulating layer 4 may be formed of the same material as a spacer 4' formed on a sidewall of the gate electrode 3'.

A second source layer 13 may be positioned on the first source layer 3, and may be in direct contact with an upper surface of the first source layer 3. The second source layer 13 may has at least one groove G on an upper surface thereof. An oxide layer 14 may be formed on a surface of the groove G, and the groove G may be filled with a conductive pattern 15. Here, the conductive pattern 15 may be formed of the same material as a conductive layer 16. The second source layer 13 may be separated into a plurality of patterns by a third insulating layer 11. The third insulating layer 11 may be formed of the same material as a second interlayer insulating layer 11' formed in the peripheral region P.

The first source layer 3 and the second source layer 13 may be electrically connected to each other, and may include silicon. For example, the first source layer 3 may be a polysilicon layer formed through a deposition process, and the second source layer 13 may be a polysilicon layer formed through a selective growth process.

A stack structure ST may be positioned over the second source layer 13, and may include conductive layers 16 and insulating layers 17, which are alternately stacked. Here, the conductive layers 16 may contain a metal such as tungsten, and the insulating layers 17 may contain oxides and/or nitrides. At least one of conductive layers 16 disposed at upper levels (e.g., the uppermost conductive layer 16) may be an upper select line. At least one of the conductive layers 16 disposed at lower levels (e.g., the lowermost conductive layer 16) may be a lower select line. The other conductive layers 16 may be word lines.

A plurality of channel layers 19 may pass through the stack structure ST, and may be in contact with the second source layer 13. Here, the plurality of channel layers 19 may extend down to the first source layer 3 by completely passing through the second source layer 13, and may be in contact with the first source layer 3.

The channel layers 19 may include a semiconductor material such as silicon (Si) or germanium (Ge). Each of the channel layers 19 may include a gap-fill insulating layer 20 formed in an open central region thereof. Also, a memory layer 18 may surround sidewalls of each of the channel layers. Here, the memory layer 18 may include a tunnel insulating layer, a data storage layer, and a charge blocking layer. Here, the data storage layer may be a layer that stores electric charges such as electrons. Examples of the data storage layer may include a silicon material, a nitride material, a charge trapping material, a phase-change material, a ferroelectric material, a nano-dot material, etc.

A first slit SL1 may be formed with a depth such that it extends to a certain depth from the surface of the stack structure ST. For example, the first slit SL1 may be formed with a depth such that it passes through conductive layers 16 that are formed to be used for upper select lines. A slit insulating layer 23 may be positioned in the first slit SL1, and the conductive layers 16 for upper select lines, which are positioned at the same level, may be insulated from each other by the slit insulating layer 23.

A second slit SL2 may have a depth such that it exposes the groove G of the second source layer 13 by passing through the stack structure ST. A source pick-up line 22 may be positioned in the second slit SL2 and the groove G, and may be in contact with the second source layer 13. In addition, an insulative spacer 21 may surround sidewalls of the source pick-up line 22 to insulate the source pick-up line 22 and the conductive layers 16 from each other.

A driving circuit may be positioned in the peripheral region P of the substrate 1. The driving circuit may include a transistor. The transistor may be positioned at the substantially same level as the first source layer 3, and may be formed of the same material as the first source layer 3. A first etch stop layer 5 and 6, a first interlayer insulating layer 7, and a second etch stop layer 8 may be positioned over the gate electrode 3' and spacer 4' of the transistor. Here, the first etch stop layer 5 and 6 may be a layer that is formed by stacking an oxide layer 5 and a nitride layer 6, and the second etch stop layer 8 may contain nitrides. In addition, the second interlayer insulating layer 11' and a third interlayer insulating layer 12 may be stacked on the second etch stop layer 8, and a resistor pattern 9 and a hard mask 10 may be positioned in the second interlayer insulating layer 11.

Figure 1B:
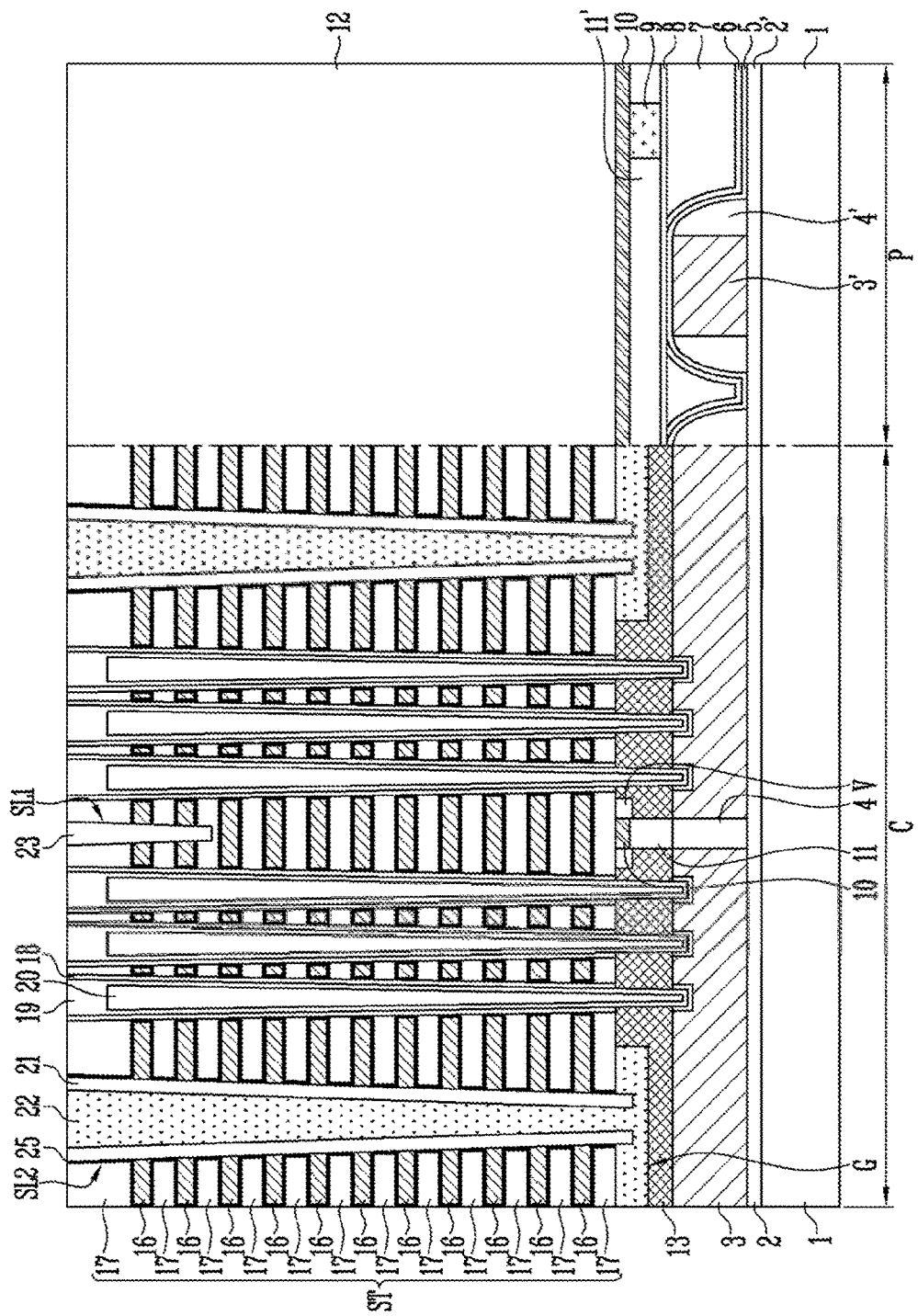

Referring to FIG. 1B, the source pick-up line 22 may be positioned in the second slit SL2 and the groove G. The source pick-up line 22 may include a first region positioned in the groove G and a second region positioned in the second slit SL2, and the second region may have a narrower width than the first region. Here, the source pick-up line 22 may be in direct contact with the second source layer 13, and therefore the first source layer 3, the second source layer 13, and the source pick-up line 22 may be electrically connected to each other.

At least a portion of the hard mask 10 may remain on the third insulating layer 11 of the cell region C, and a void V may exist around the hard mask 10. In addition, a memory layer 25 may be additionally formed between the conductive layers 16 and the memory layers 18. The additionally formed memory layer 25 may be a charge blocking layer.

The rest of the structure may be the same as described with reference to FIG. 1A.

Figure 1C:
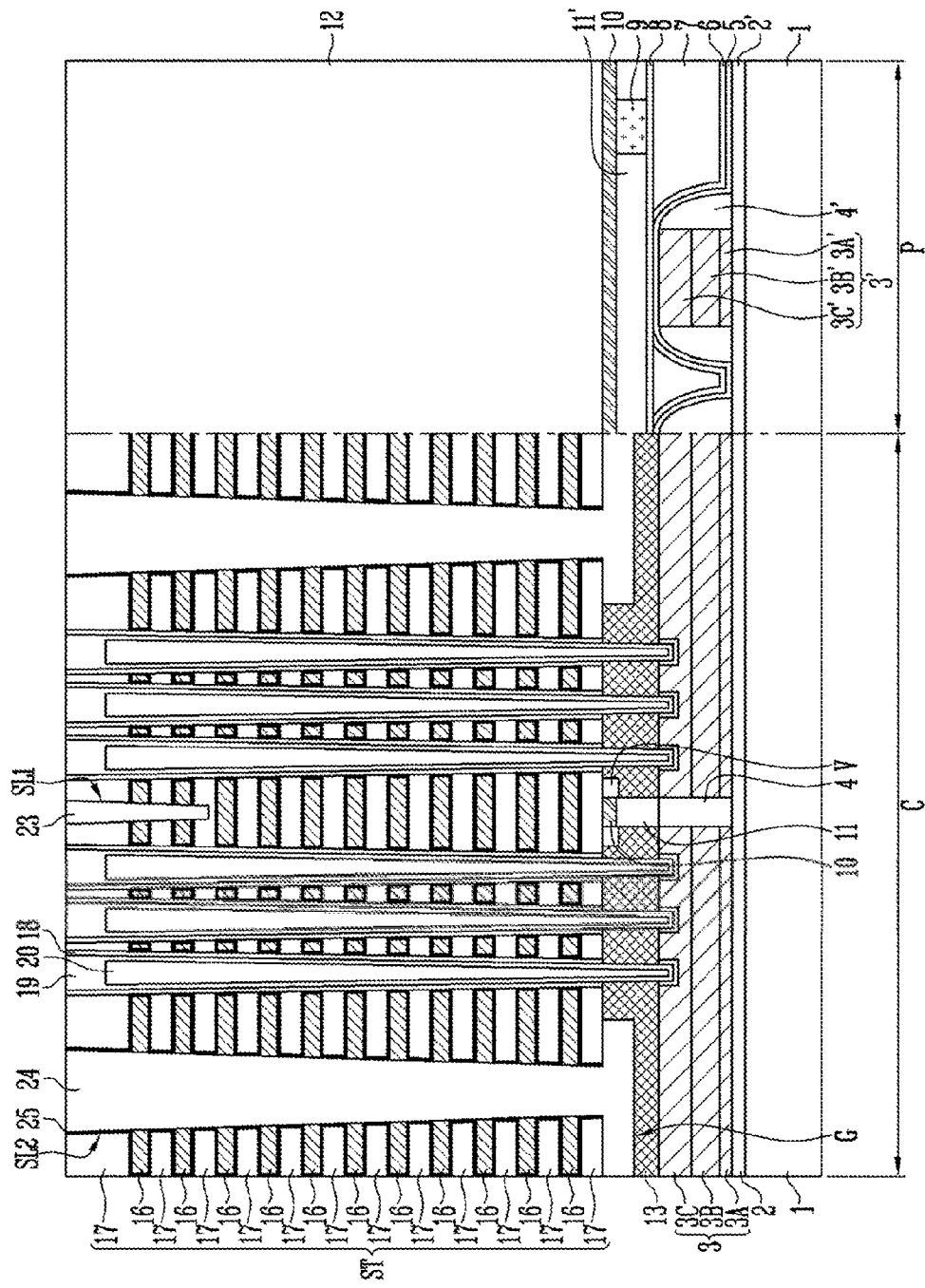

Referring to FIG. 1C, the first slit insulating layer 23 may be formed in the first slit SL1, and a second slit insulating layer 24 may be formed in the second slit SL2 and the groove G. Here, the second slit insulating layer 24 may be in contact with the second source layer 13.

The first source layer 3 may include a polysilicon layer 3A, a metal layer 3B, and a polysilicon layer 3C, and the metal layer 3B may include tungsten. The gate electrode 3' may include a polysilicon layer 3A', a metal layer 3B', and a polysilicon layer 3C', and the metal layer 3B' may include tungsten. Thus, although a source pick-up line containing a metal is not separately formed, a source resistance can be decreased by the metal layer 3B included in the first source layer 3. Although not illustrated, a source pick-up contact plug may be connected to the metal layer 3B. In addition, the resistance of the gate electrode 3' can be decreased by the metal layer 3B'. The rest of the structure may be the same as described with reference to FIG. 1A or 1B.

Figure 1D:
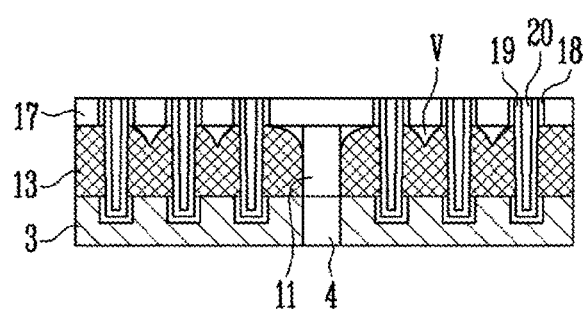

FIG. 1D illustrates an enlargement of the second source layer 13 of FIG. 1A to discuss an embodiment in which the second source layer 13 includes an uneven upper surface. In this case, at least one void V may exist between the second source layer 13 and the stack structure ST. Here, the void V refers to an empty space in which any material layer does not exist. Like FIG. 1D, in the sectional views of FIGS. 1B and 1C, the second source layer 13 may include an uneven upper surface, and at least one void V may exist between the second source layer 13 and the stack structure ST.

FIGS. 2A to 2G are sectional views illustrating an example manufacturing method of a semiconductor device according to an embodiment of the present disclosure.

Figure 2A:
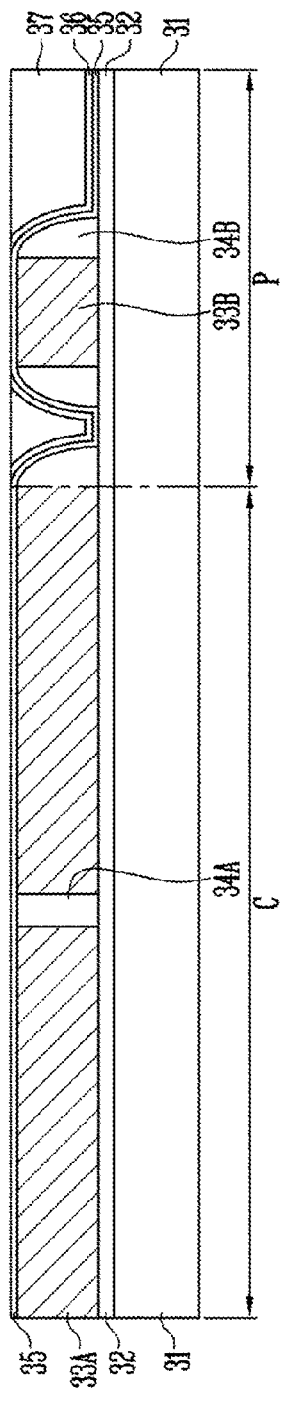

Referring to FIG. 2A, a first insulating layer 32 and a first conductive layer may be formed on a substrate 31 including a cell region C and a peripheral region P. Subsequently, the first conductive layer may be patterned, thereby forming a first source layer 33A of the cell region C and a gate electrode 33B of the peripheral region P. Subsequently, an insulating material may be formed along the entire surface of the resultant structure in which the first source layer 33A and the gate electrode 33B have been formed, and then a blanket etching process is performed to the insulating material. Accordingly, a second insulating layer 34A and a space spacer 34B of the gate electrode 33B may be formed which separate the first source layer 33A of the cell region C into a plurality of patterns.

Subsequently, a first etch stop layer 35 and 36 and a first interlayer insulating layer 37 may be formed along the entire surface of the resultant structure. Here, the first etch stop layer 35 and 36 may be a layer that is formed by stacking an oxide layer 35 and a nitride layer 36, and the first interlayer insulating layer 37 may be a high density plasma (HDP) oxide layer. Subsequently, a planarization process may be performed to planarize the first interlayer insulating layer 37 until the first etch stop layer 35 and 36 is exposed. For example, a chemical mechanical polishing (CMP) may be performed until the first etch stop layer 35 and 36 is exposed, and the exposed nitride layer 36 may be etched back. Accordingly, the oxide layer 35 may be exposed on the first source layer 33A and on the gate electrode 33B.

Figure 2B:
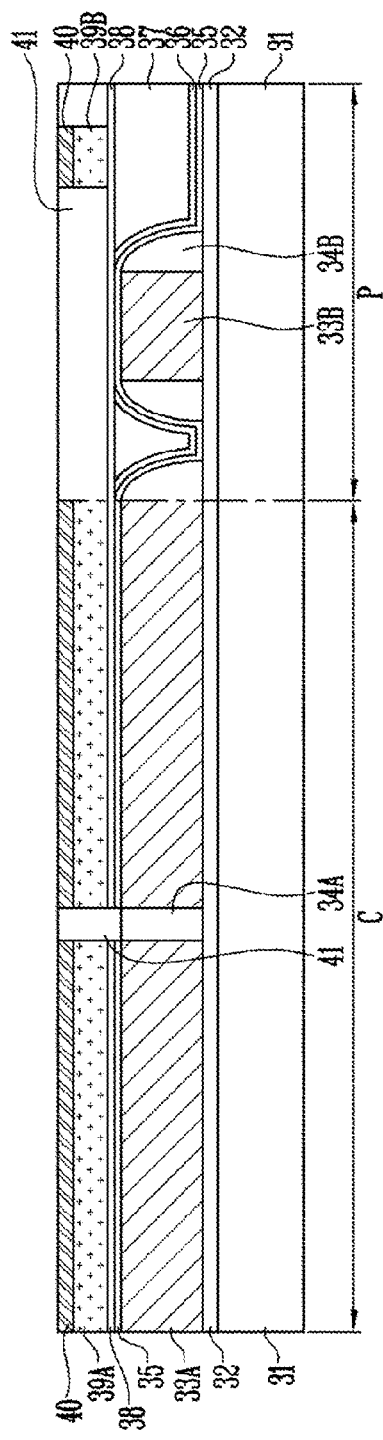

Referring to FIG. 2B, a second etch stop layer 38, a second conductive layer, and a hard mask layer may be formed on the resultant structure. Here, the second conductive layer may be a polysilicon layer, and the hard mask layer may be a nitride layer formed through a low pressure chemical vapor deposition (LP-CVD).

Subsequently, the hard mask layer and the second conductive layer may be patterned, thereby forming a second source sacrificial layer 39A of the cell region C and a resistor pattern 39B of the peripheral region P. Here, the resistor pattern 39B may be positioned such that it is not overlapped with a transistor. In addition, a hard mask pattern 40 may remain over the second source sacrificial layer 39A and the resistor pattern 39B.

Subsequently, an insulating material may be formed on the entire surface of the resultant structure, and then the insulating material may be planarized until the hard mask pattern 40 is exposed, thereby forming a second interlayer insulating layer 41.

Figure 2C:
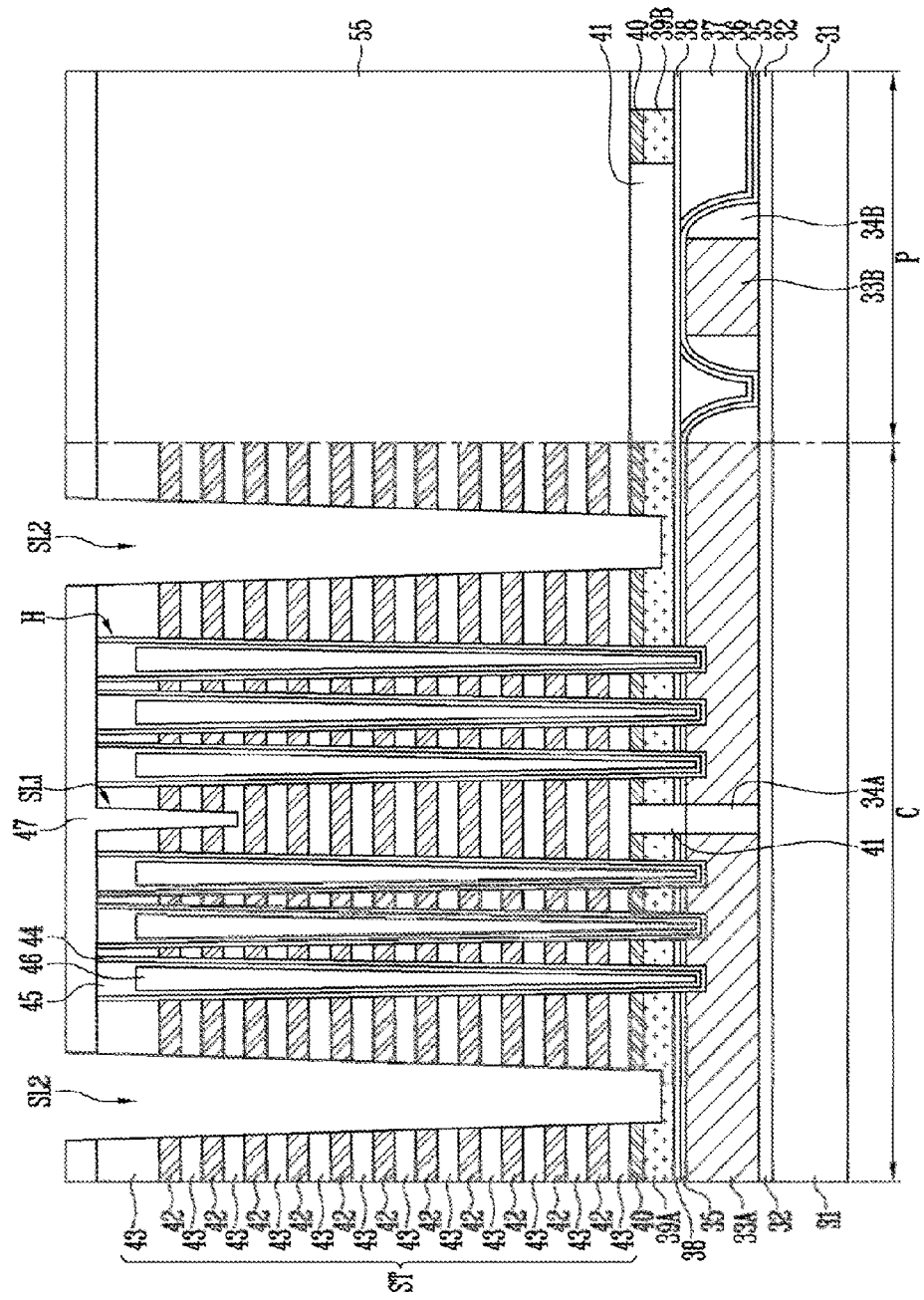

Referring to FIG. 2C, a stack structure ST may be formed over the resultant structure in which the second interlayer insulating layer 41 has been formed. Here, the stack structure ST may include first material layers 42 and second material layers 43, which are alternately stacked. The first material layers 42 may include a material having a high etching selection ratio with respect to the second material layers 43. For example, the first material layers 42 may be sacrificial layers containing nitrides, and the second material layers 43 may be insulating layers containing oxides. The first material layers 42 may be conductive layers containing polysilicon materials, and the second material layers 43 may be insulating layers containing oxides. The first material layers 42 may be conductive layers containing a dopant, and the second material layers 43 may be sacrificial layers containing no dopant. The first material layers 42 may be first sacrificial layers containing nitrides, and the second material layers 43 may be second sacrificial layers containing oxides.

For reference, the stack structure ST may be formed in both the cell region C and the peripheral region P, or may be formed in only the cell region C. For example, after the stack structure ST is formed over the substrate 31 including the cell region C and the peripheral region P, the stack structure ST formed in the peripheral region P may be removed, and a third interlayer insulating layer 55 may be formed.

Subsequently, holes H passing through the stack structure ST of the cell region C may be formed. Here, the holes H may completely pass through the stack structure ST and extend down to the first source layer 33A or the second source sacrificial layer 39A. For example, each of the holes H may completely pass through the stack structure ST, the second source sacrificial layer 39A, the second etch stop layer 38, and the first etch stop layer 35, and may be formed with a depth such that it extends to a certain depth from the surface of the first source layer 33A.

Subsequently, a channel layer 45 and a memory layer 44 surrounding the channel layer 45 may be formed in each of the holes H. Here, the channel layer 45 may include a semiconductor material such as silicon (Si) or germanium (Ge). The channel layer 45 may include a gap-fill insulating layer 46 formed in an opened central region thereof. The memory layer 44 may include a tunnel insulating layer, a data storage layer, and a charge blocking layer. The data storage layer may contain a silicon-based material, a nitride material, a phase-change material, a ferroelectric material, or a nano-dot material.

Subsequently, a first slit SL1 may be formed such that it extends to a certain depth from the surface of the stack structure ST. For example, the first slit SL1 may be formed with a depth such that it passes through the first material layers 42 for upper select lines. Subsequently, a slit insulating layer 47 may be formed in the first slit SL1. The slit insulating layer 47 may be formed over the stack structure ST.

Subsequently, second slits SL2 may be formed to expose the second source sacrificial layer 39A by passing through the stack structure ST. When the second slits SL2 are formed, at least a portion of the second source sacrificial layer 39A may be etched. The first material layers 42 and the second source sacrificial layer 39A are exposed through the second slits SL2.

Referring to FIG. 2D, a protective layer 48 may be formed in the second slits SL2, and a mask pattern 49 may then be formed such that it surrounds upper inner walls of the second slits SL2. Here, the protective layer 48 may be formed with a uniform thickness along inner surfaces of the second slits SL2 by using a method having a relatively excellent step coverage, and the mask pattern 49 may be formed in an overhang shape in only openings of the second slits SL2 by using a method having a relatively poor step coverage. For example, the protective layer 48 may be a nitride layer formed through a low pressure chemical vapor deposition (LP-CVD), and the mask pattern 49 may be a nitride layer formed through a physical vapor deposition (PVD).

Subsequently, the protective layer 48 formed on a bottom surface of the second slit SL2 may be etched using the mask pattern 49 as an etching barrier, thereby exposing the second source sacrificial layer 39A.

Figure 2E:
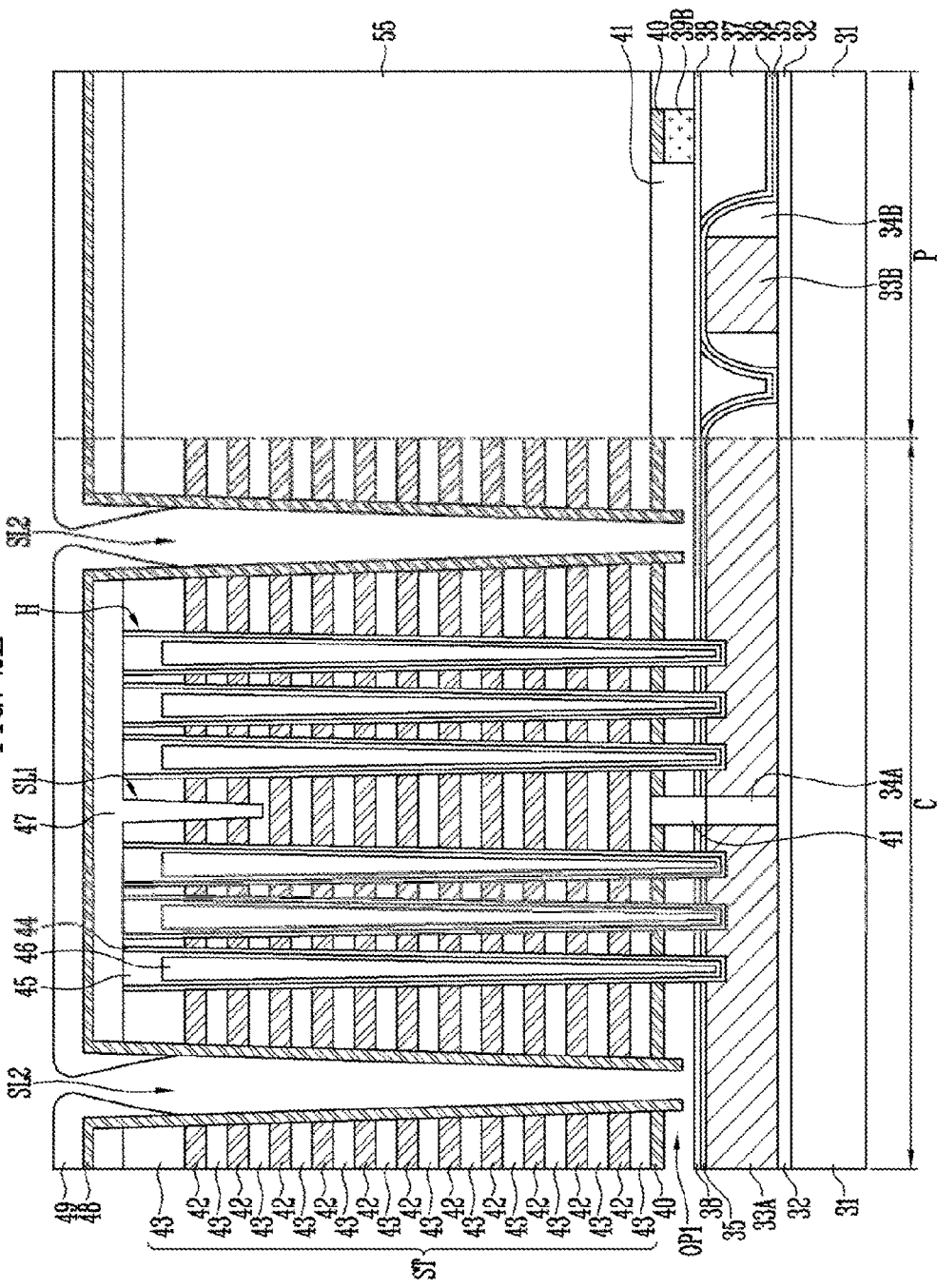

Referring to FIG. 2E, the second source sacrificial layer 39A may be removed through the second slits SL2, thereby forming a first opening OP1. At this time, the first and second material layers 42 and 43 are protected by the protective layer 48, and thus the second source sacrificial layer 39A can be selectively removed. In addition, the memory layers 44 and the second etch stop layer 38 may be exposed through the first opening OP1.

Figure 2F:
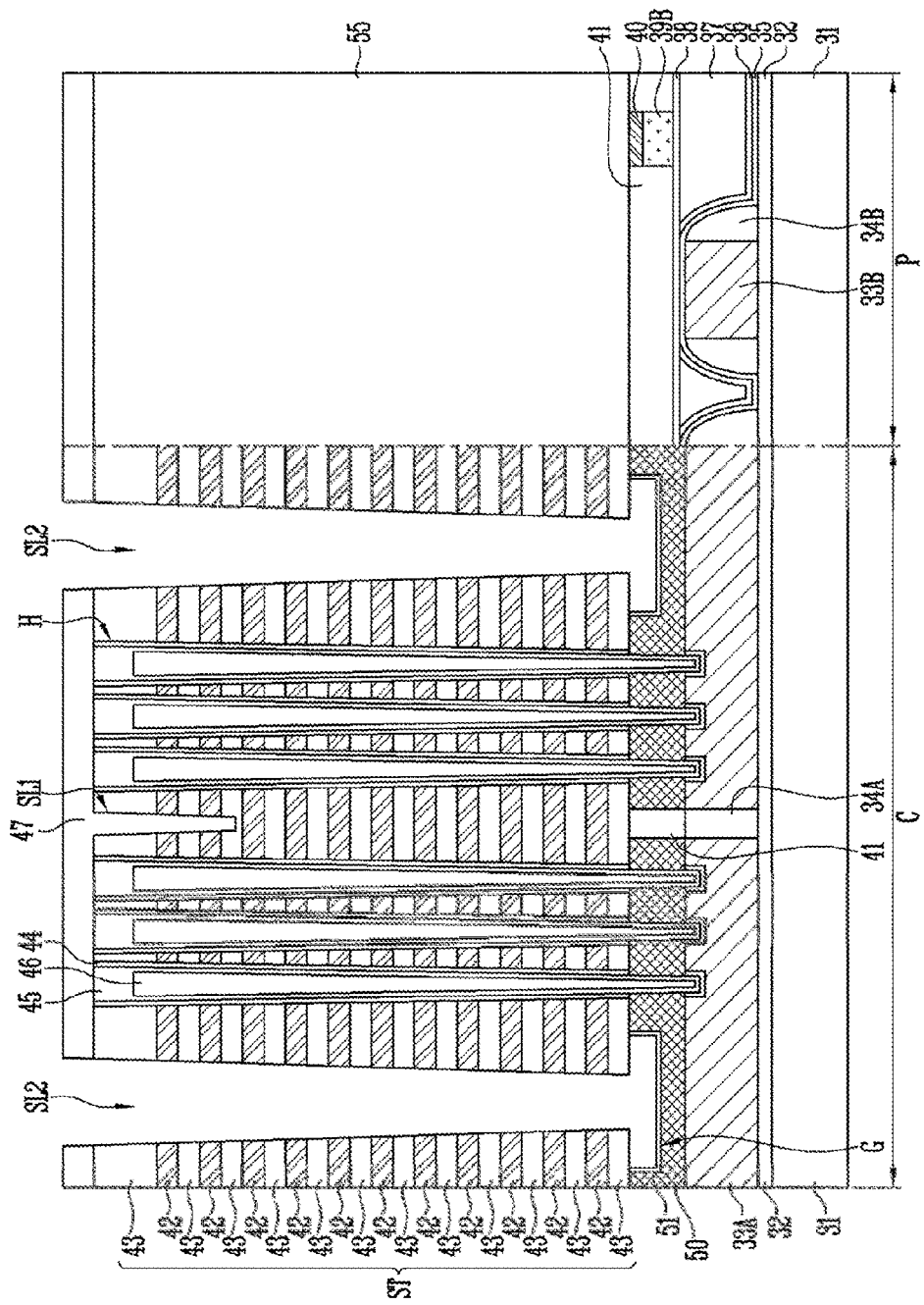

Referring to FIG. 2F, the exposed memory layers 44 may be removed through the first opening OP1. As a result, the channel layers 45 may be exposed in the first opening OP1. In the process of removing the memory layers 44, the first etch stop layer 35 and the second etch stop layer 38 may be removed together with the memory layers 44, so that the first source layer 33A can be exposed in the first opening OP1. Also, in the process of removing the memory layers 44, the hard mask pattern 40 may be removed together with the memory layers 44, so that the lowermost second material layer 43 can be exposed in the first opening OP1. For reference, in the process of removing the memory layers 44, the protective layer 48 and the mask pattern 49 may be removed together with the memory layers 44. Alternatively, the protective layer 48 and the mask pattern 49 may be removed through a separate process.

Subsequently, a second source layer 50 including a groove G, which is in contact with the channel layer 45 and positioned under the second slit SL2, may be formed in the first opening OP1. Here, the second source layer 50 may be a polysilicon layer formed through selective growth. In this case, since the polysilicon layer is grown from surfaces of the channel layers 45 and the first source layer 33A, the growth of the polysilicon layer at a bottom portion of the second slit SL2 may be lower than the other portions, thereby forming the groove G. Although not illustrated, at least one void, as described with reference to FIG. 1D, may be formed between the second source layer 50 and the stack structure ST.

Subsequently, an oxide layer 51 may be formed in the groove G. For example, at least a part of the source layer 50 exposed through the second slit SL2 may be oxidized by performing an oxidation process such as a wet oxidation process. When the wet oxidation process is used, the second source layer 50 including polysilicon may be selectively oxidized without oxidizing the first material layers 42 containing nitrides. Thus, the oxide layer 51 can be formed in only the groove G.

Figure 2G:
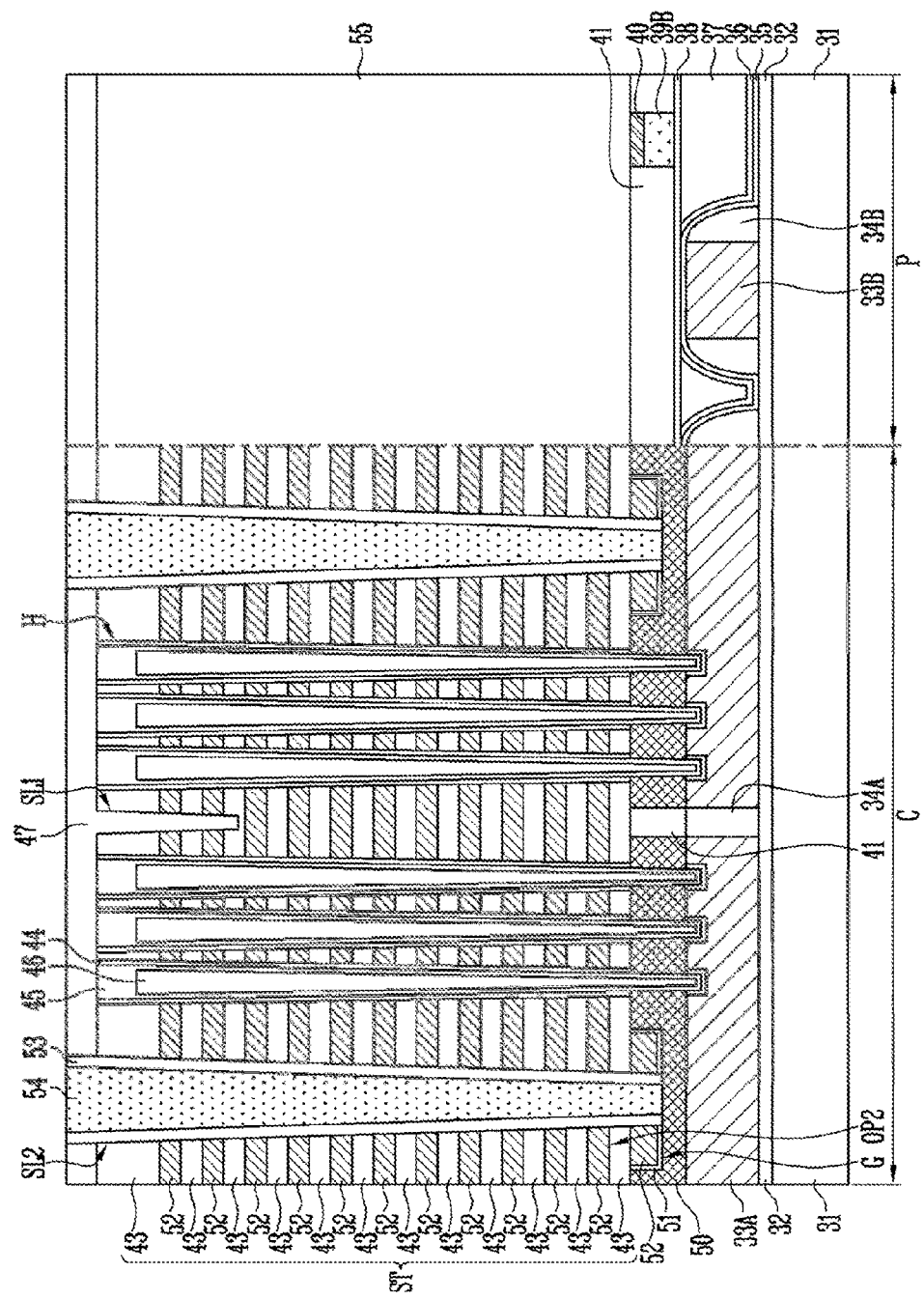

Referring to FIG. 2G, the first material layers 42 exposed through the second slits SL2 may be removed, thereby forming second openings OP2. The oxide layer 51 formed in the groove G can prevent an etchant from infiltrating into the stack structure ST and damaging the memory layer 44. Thus, the oxide layer 51 can be used as a protective layer when the second openings OP2 are formed.

Subsequently, third conductive layers 52 may be formed in the second openings OP2 and the groove G. Before the third conductive layers 52 are formed, at least a part of a memory layer, e.g., a charge blocking layer may be further formed in the second openings OP2. When the third conductive layers 52 are formed in the second slits SL2, the third conductive layers 52 formed in the second slits SL2 may be removed such that the third conductive layers 52 stacked through the second openings OP2 are insulated from each other.

Subsequently, an insulative spacer 53 may be formed on inner walls of the second slits SL2, and a source pick-up line 54 may then be formed in the second slits SL2. For example, an oxide layer is deposited in the second slits SL2, and an overhang-shaped mask pattern (not illustrated) containing titanium nitride (TiN) is then formed in the opening of the second slit SL2 through physical vapor deposition (PVD). Subsequently, the oxide layer formed on bottom surfaces of the second slits SL2 may be removed by performing an etching process. Accordingly, the insulative spacer 53 can be formed.

Here, the source pick-up line 54 may contain a metal such as titanium nitride (TiN) or tungsten. The third conductive layer 52 formed in the groove G may be electrically connected to the source pick-up line 54 and the second source layer 50.

FIGS. 3A to 3I are sectional views illustrating an example manufacturing method of a semiconductor device according to an embodiment of the present disclosure. Hereinafter, any repetitive detailed description will be omitted or simplified.

Referring to FIG. 3A, a first insulating layer 62 and a first conductive layer may be formed on a substrate 61 including a cell region C and a peripheral region P. Subsequently, the first conductive layer may be patterned, thereby forming a first source layer 63A of the cell region C and a gate electrode 63B of the peripheral region P. Subsequently, an insulating material may be formed along the entire surface of the resultant structure in which the first source layer 63A and the gate electrode 63B have been formed, and then an etching process may be conducted. Accordingly, a second insulating layer 64A and a space spacer 64B of the gate electrode 63B, which separate the first source layer 63A of the cell region C into a plurality of patterns, may be formed.

Subsequently, a first etch stop layer 65 and 66 and a first interlayer insulating layer 67 may be formed along the entire surface of the resultant structure. Here, the first etch stop layer 65 and 66 may be a layer that is formed by stacking an oxide layer 65 and a nitride layer 66.

Referring to FIG. 3B, a second etch stop layer 68 and a second conductive layer may be formed on the resultant structure, and the second conductive layer may then be patterned, thereby forming a second source sacrificial layer 69A of the cell region C and a resistor pattern 69B of the peripheral region P. Subsequently, a second interlayer insulating layer 70 may be formed.

Figure 3C:
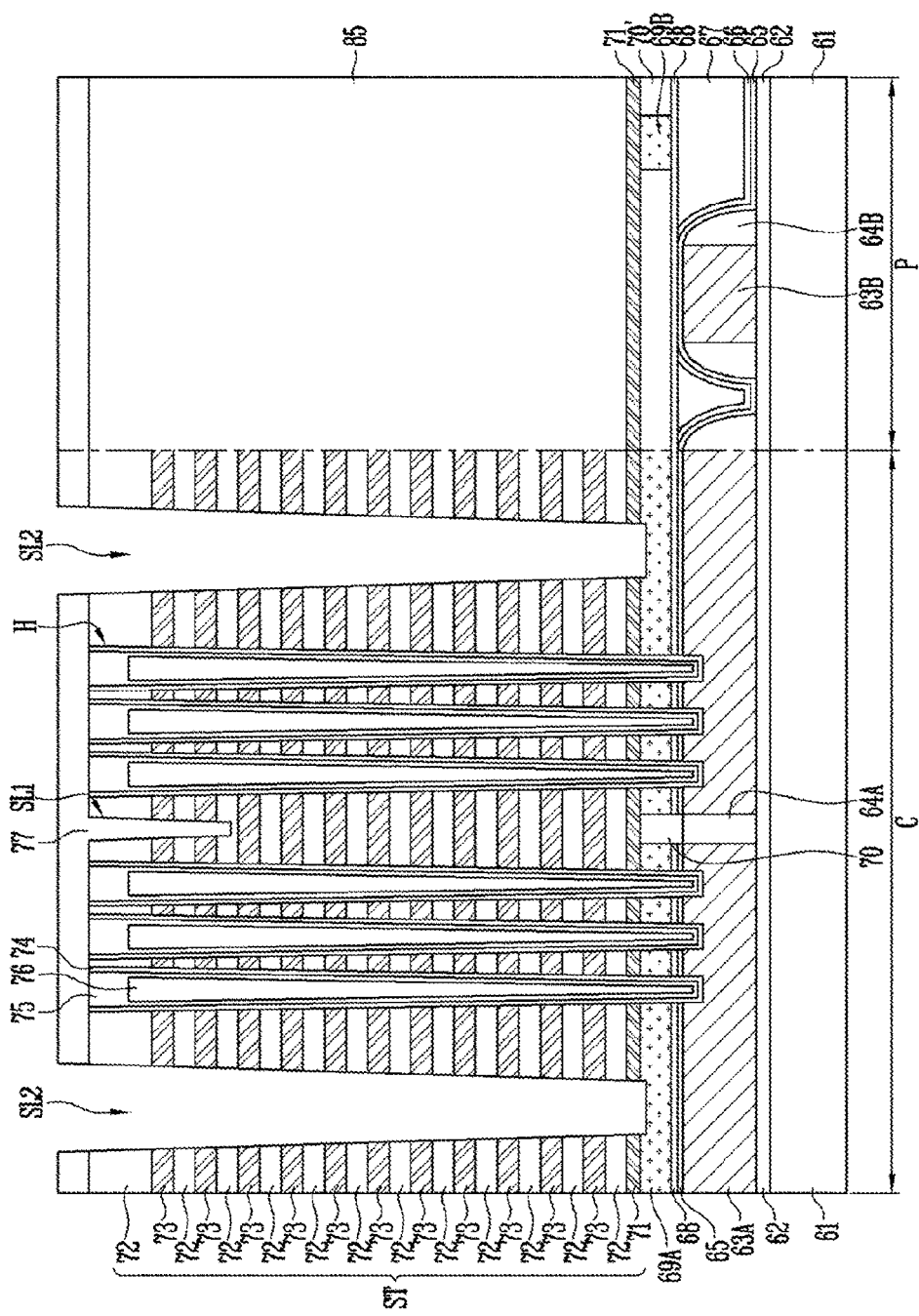

Referring to FIG. 3C, a stack structure ST may be formed over the resultant structure in which the second interlayer insulating layer 70 has been formed. Here, the stack structure ST may include a first material layer 71, and second material layers 72 and third material layers 73, which are alternately stacked on the first material layer 71. For reference, the second and third material layers 72 and 73 formed in the peripheral region P may be removed to form a third interlayer insulating layer 85.

The first and third material layers 71 and 73 may include a material having a high etching selection ratio with respect to the second material layers. For example, the first and third material layers 71 and 73 may be sacrificial layers containing nitrides, and the second material layers 72 may be insulating layers containing oxides. The first and third material layers 71 and 73 may be conductive layers including polysilicon materials, and the second material layers 72 may be insulating layers containing oxides. The first and third material layers 71 and 73 may be conductive layers including a dopant, and the second material layers 72 may be sacrificial layers including no dopant. The first and third material layers 71 and 73 may be first sacrificial layers containing nitrides, and the second material layers 72 may be second sacrificial layers containing oxides.

The first material layer 71 and the third material layers 73 may be formed in different manners. For example, the first material layer 71 may be a nitride layer formed through low pressure chemical vapor deposition (LP-CVD), and the third material layers 73 may be nitride layers formed through plasma enhanced chemical vapor deposition (PE-CVD). Thus, the third material layers 73 can have a high etching ratio with respect to the first material layer 71. In addition, the first material layer 71 may be formed with a thinner thickness than the third material layer 73. For example, the first material layer 71 may be formed with a thickness of about 30 to 50 Å.

Subsequently, holes H passing through the stack structure ST may be formed. Here, the holes H may completely pass through the stack structure ST and extend down to the first source layer 63A or the second source sacrificial layer 69A. Subsequently, a channel layer 75 and a memory layer 74 surrounding the channel layer 75 may be formed in each of the holes H. Here, the channel layer 75 may include a semiconductor material such as silicon (Si) or germanium (Ge). The channel layer 75 may include a gap-fill insulating layer 76 formed in an opened central region thereof. The memory layer 74 may include a tunnel insulating layer, a data storage layer, and a charge blocking layer. The data storage layer may contain a silicon-based material, a nitride material, a phase-change material, a ferroelectric material, or a nano-dot material.

Subsequently, a first slit SL1 may be formed such that it extends to a certain depth from the surface of the stack structure ST. For example, the first slit SL1 is formed with a depth such that it passes through the third material layers 73 for upper select lines. Subsequently, a slit insulating layer 77 may be formed in the first slit SL1. The slit insulating layer 77 may be formed over the stack structure ST.

Subsequently, second slits SL2 may be formed to expose the second source sacrificial layer 69A by passing through the stack structure ST. When the second slits SL2 are formed, at least a portion of the second source sacrificial layer 69A may be etched.

Referring to FIG. 3D, the first and third material layers 71 and 73 may be selectively removed through the second slits SL2. Accordingly, a first opening OP1 may be formed in a region in which the first material layer 71 is removed, and second openings OP2 may be formed in regions in which the third material layers 73 are removed. As an example, when the first material 71 is thinner than the third material layers 73, an amount etched from the first material layer 71 may be smaller than an amount etched from the third material layers 73. As another example, when the third material layers 73 have a higher etching ratio than the first material layer 71, the amount etched from the first material layer 71 may be smaller than the amount etched from the third material layers 73. Thus, while a part of the first material layer 71 relatively close to the second slits SL2 is being removed, the other part of the first material layer relatively distant from the second slits SL2 may remain unetched.

Figure 3E:
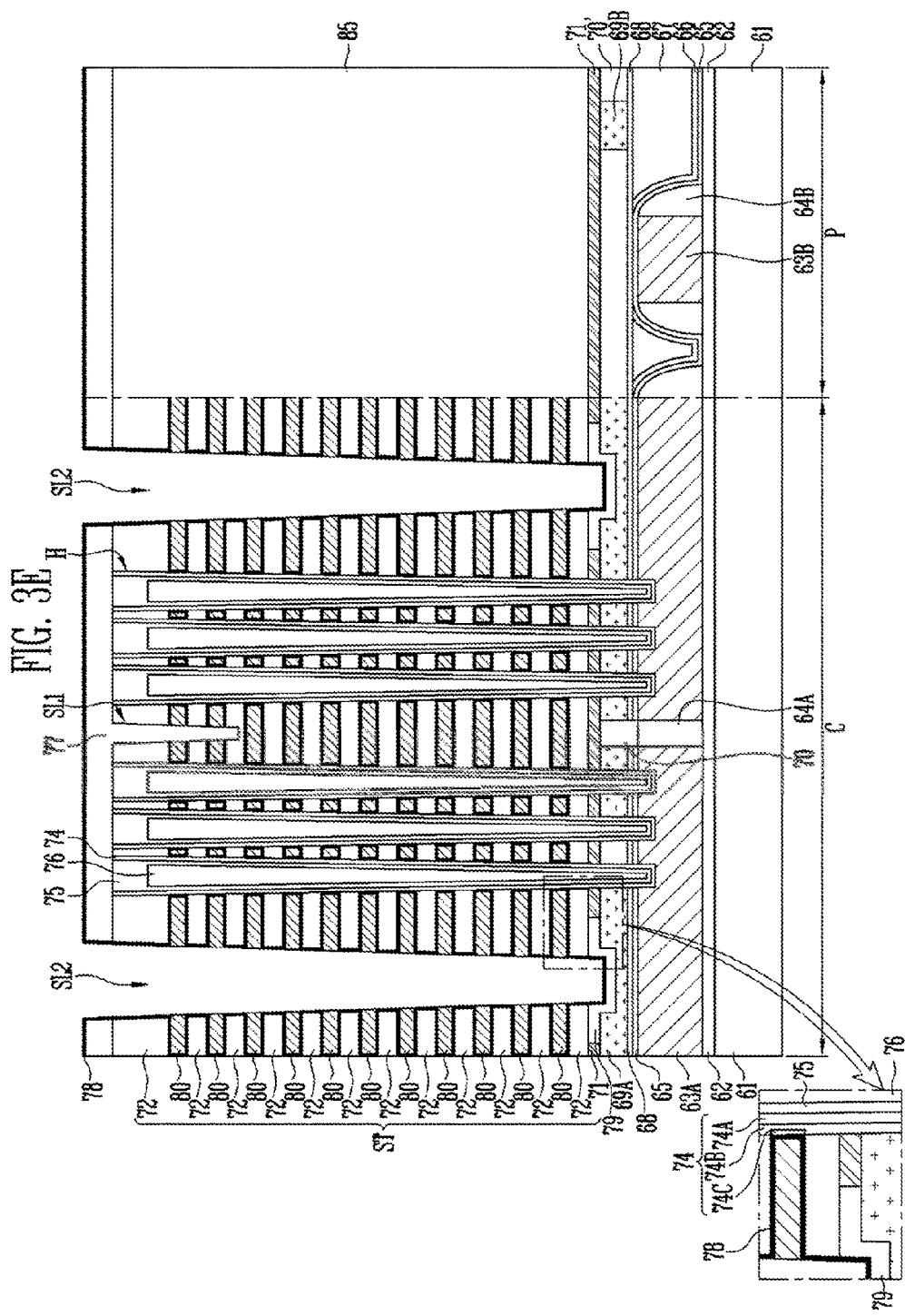

Referring to FIG. 3E, a memory layer 78 may be further formed in the second openings OP2. For example, when the memory layer 74 includes a tunnel insulating layer 74A and a data storage layer 74B, a data storage layer 74B may be exposed through the second openings OP2. Thus, at least a part of the data storage layer 74B may be oxidized by through an oxidation process, thereby forming a first charge blocking layer 74C. Subsequently, a second charge blocking layer including a high dielectric constant (high-k) material such as $Al_2O_3$ may be formed in the second openings OP2. Here, the second charge blocking layer may be the memory layer 78. According to an embodiment, in the process of oxidizing a part of the data storage layer 74B, surfaces of the first material layer 71 and the second source sacrificial layer 69A, which are exposed through the second slit SL2 and the first opening OP1, may be oxidized. Therefore, a first protective layer 79 positioned on the second source sacrificial layer 69A may be formed in the first opening OP1. When the first opening OP1 is not completely filled through the oxidation process, the memory layer 78 may be formed in the first opening OP1.

Subsequently, third conductive layers 80 may be formed in the second openings OP2. Here, the third conductive layers 80 may contain a metal such as tungsten. When the third conductive layer 80 may be formed in the second slit SL2, the third conductive layer 80 formed in the second slit SL2 may be removed such that the third conductive layers 80 stacked through the second openings OP2 are insulated from each other. When the third conductive layer 80 in the second slit SL2 is removed, the first protective layer 79 can prevent damage of the second source sacrificial layer 69A.

Referring to FIG. 3F, a spacer insulating layer, a second protective layer 82, and a mask pattern 83 may be formed in the second slit SL2. Here, the spacer insulating layer may be an oxide layer, the second protective layer 82 may be a nitride layer, and the mask pattern 83 may be a titanium nitride layer or tungsten layer formed through physical vapor deposition (PVD).

Subsequently, the second protective layer 82, the spacer insulating layer, and the first protective layer 79, which are formed on a bottom surface of the second slit SL2, may be etched using the mask pattern 83 as an etching barrier. Accordingly, a spacer 81 may be formed on an inner wall of the second slit SL2, and the second source sacrificial layer 69A may be exposed.

Figure 3G:
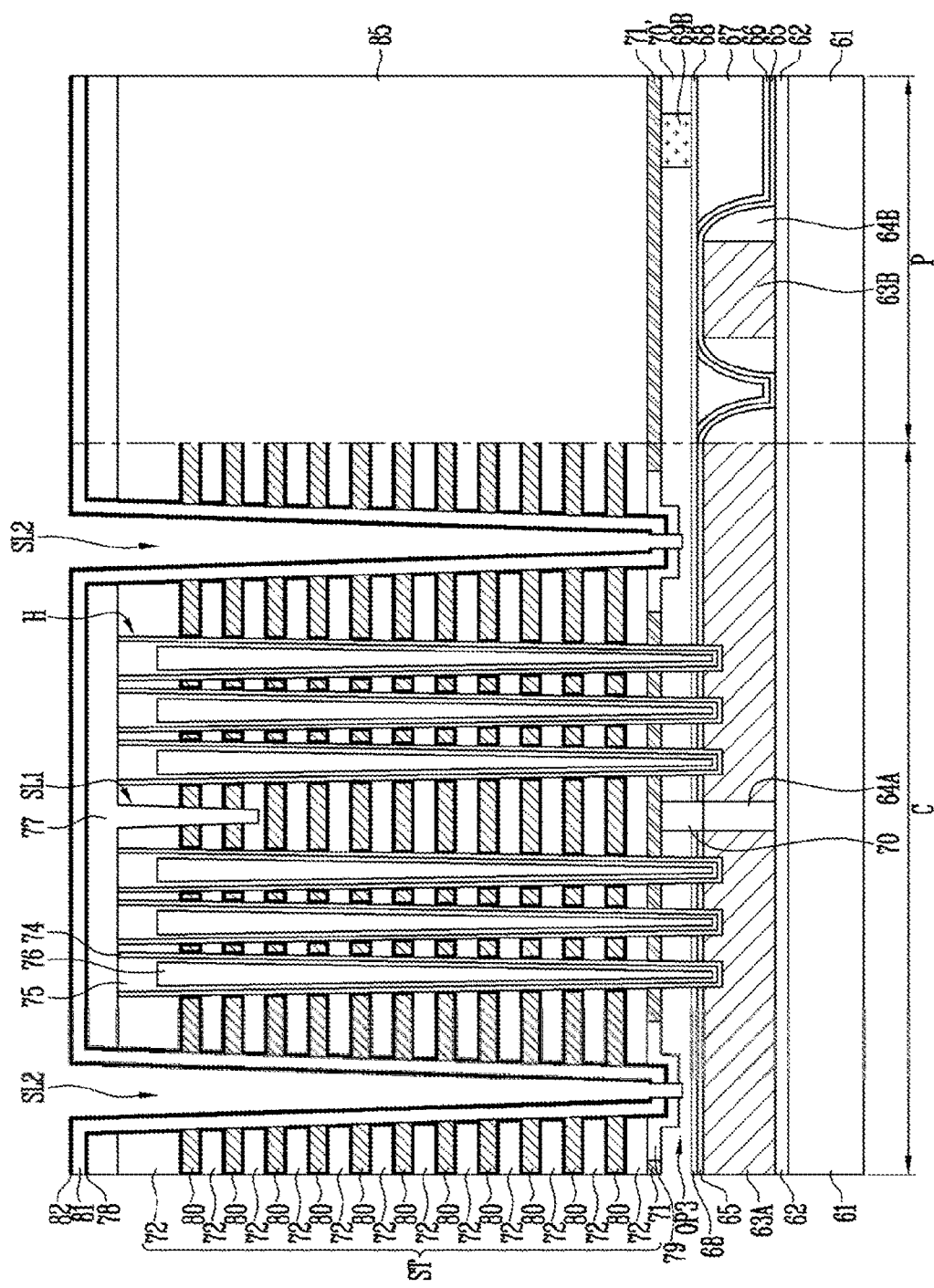

Referring to FIG. 3G, a mask pattern 83 may be removed, and the second source sacrificial layer 69A may then be removed through the second slit SL. Accordingly, a third opening OP3 may be formed, the memory layer 74, the second etch stop layer 68, the first material layer 71, and the first protective layer 79 may be exposed in the third opening OP3.

Figure 3H:
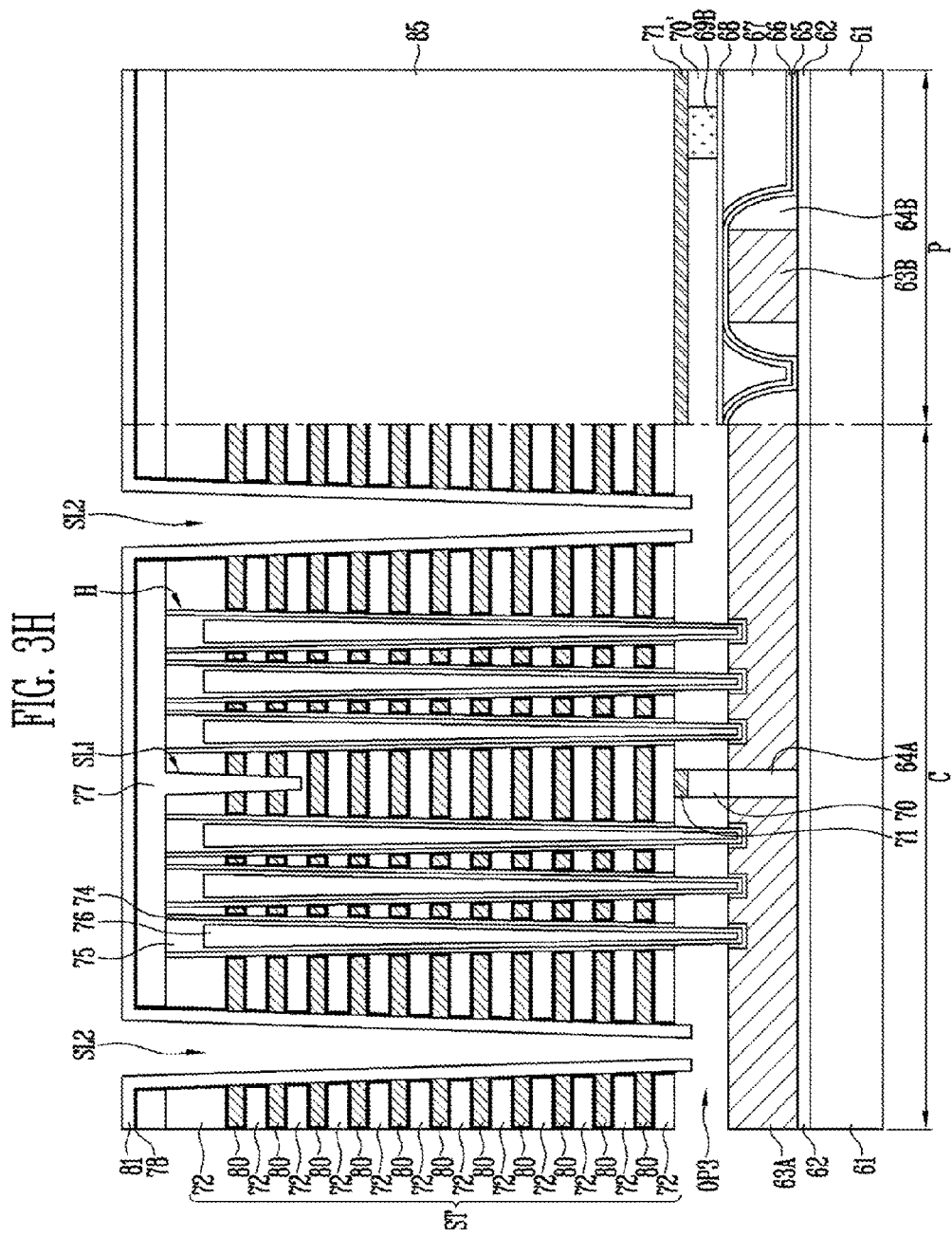

Referring to FIG. 3H, the memory layer 74 may be removed such that the channel layers 75 are exposed in the third openings OP3. The first and second etch stop layers 65 and 68 may be removed together with the memory layer 74 such that the first source layer 63A is exposed in the third opening OP3. The first material layer 71 and the first protective layer 79 may be removed together with the memory layer 74 such that the second material layer 72 is exposed in the third opening OP3. A portion of the first material layer 71 may remain on the second interlayer insulating pattern 70 of the cell region C. In addition, the second protective layer 82 may be removed together with the memory layer 74 such that the spacer 81 is exposed in the second slit SL2.

Figure 3I:
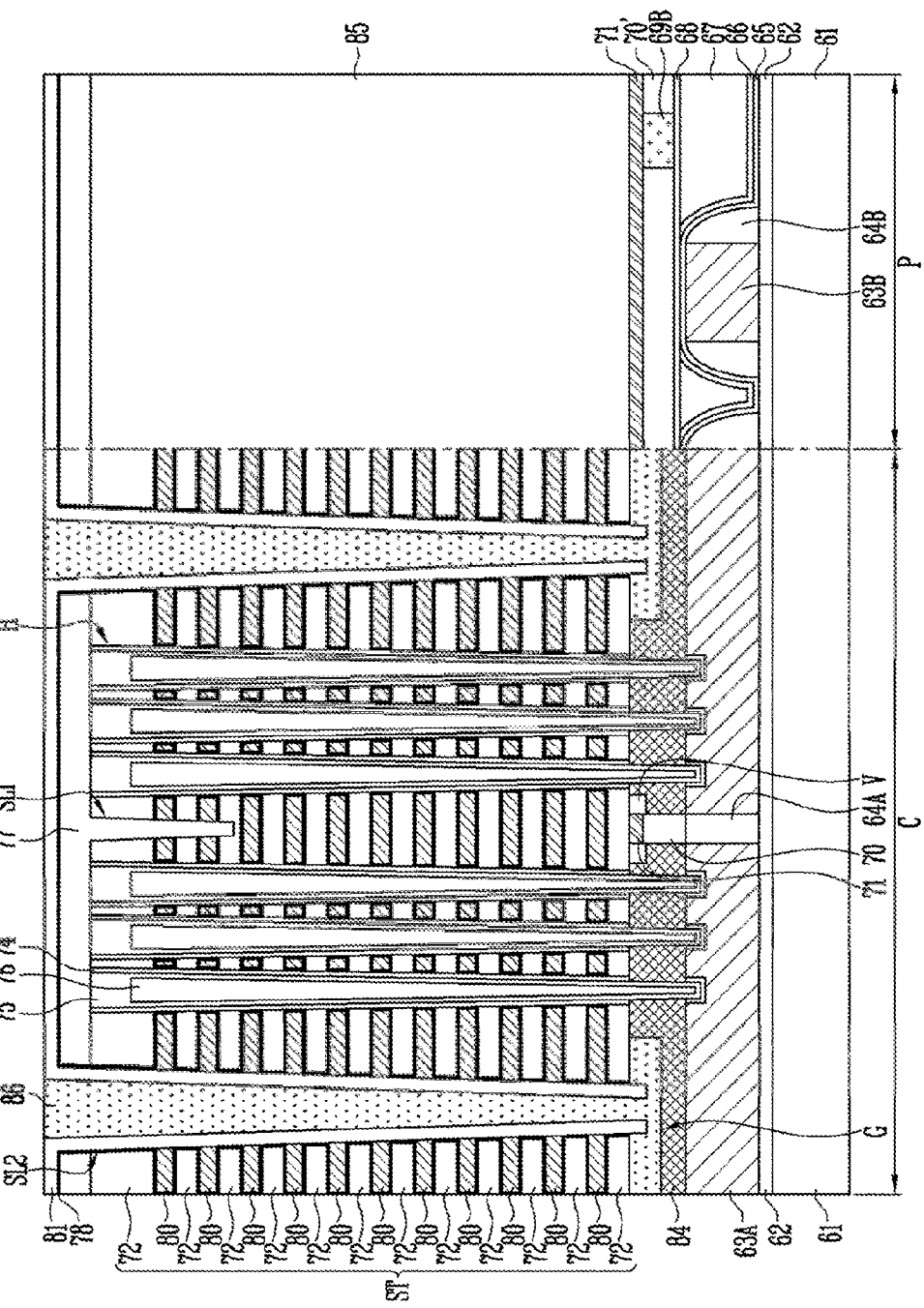

Referring to FIG. 3I, a second source layer 84 may be formed in the third opening OP3. The second source layer 84 may have a groove G. The second source layer 84 may be in contact with the channel layer 75 and positioned under the second slit SL2. In this state, a void V may be formed around the second interlayer insulating pattern 70 and the first material layer 71, which remain in the cell region C.

Subsequently, a source pick-up line 86 may be formed in the second slit SL2 and the groove G. The source pick-up line 86 is insulated from the third conductive layers 80 by the spacer 81. The source pick-up line 86 may be electrically connected to the second source layer 84. In addition, the source pick-up line 86 may include a first region formed in the groove G and a second region formed in the second slit SL2. The second region may have a narrower width than the first region.

Figure 4:
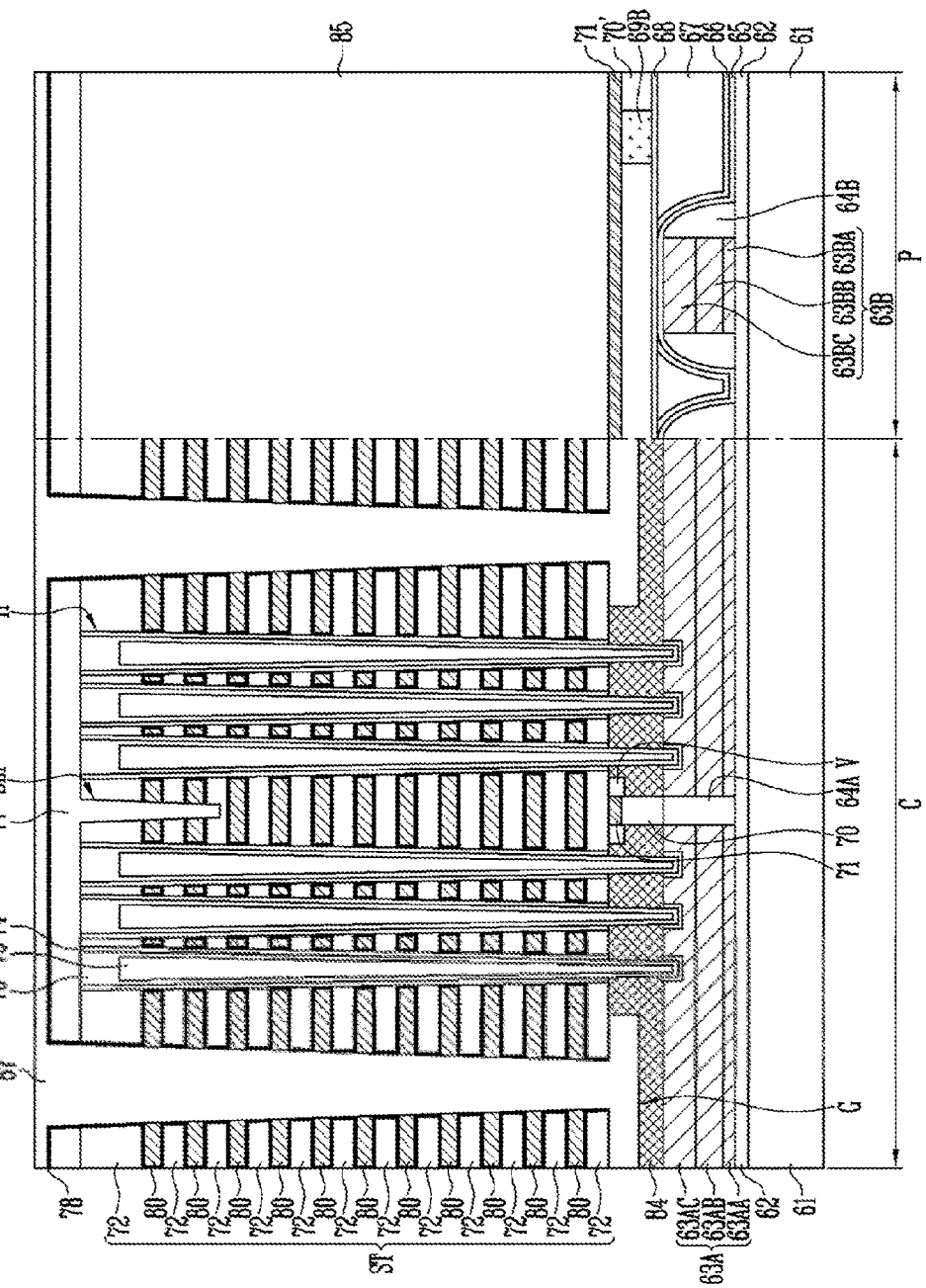
FIG. 4 is a sectional view illustrating an example manufacturing method of a semiconductor device according to an embodiment of the present disclosure.

FIG. 4 is a sectional view illustrating an example manufacturing method of a semiconductor device according to an embodiment of the present disclosure.

Referring to FIG. 4, a first source layer 63A may be a multi-layered layer. A first conductive layer may be formed by stacking a polysilicon layer, a metal layer, and a polysilicon layer. The first source layer 63A and a gate electrode 63B may be formed by patterning the first conductive layer. Accordingly, the first source layer 63A may be formed in which a polysilicon layer 63AA, a metal layer 63AB, and a polysilicon layer 63AC are stacked, and the gate electrode 63B may be formed in which a polysilicon layer 63BA, a metal layer 63BB, and a polysilicon layer 63BC are stacked. The other processes are the same as the processes described with reference to FIGS. 3A to 3H.

Subsequently, a second source layer 84 may be formed in the third opening OP3. The second source layer 84 may have a groove G. The second source layer 84 may be in contact with the channel layer 75 and positioned under the second slit SL2. In this state, a void V may be formed around the second interlayer insulating pattern 70 and the first material layer 71, which remain in the cell region C.

Subsequently, a slit insulating layer 87 may be formed in the second slit SL2 and the groove G. The slit insulating layer 87 may include a first region formed in the groove G and a second region formed in the second slit SL2. The second region may have a narrower width than the first region.

According to this structure, the metal layer 63AB included in the first source layer 63A may serve as the source pick-up line 86. Thus, the process of forming the source pick-up line may be omitted, and the slit insulating layer 87 may be formed in the second slit SL2.

Figure 5:
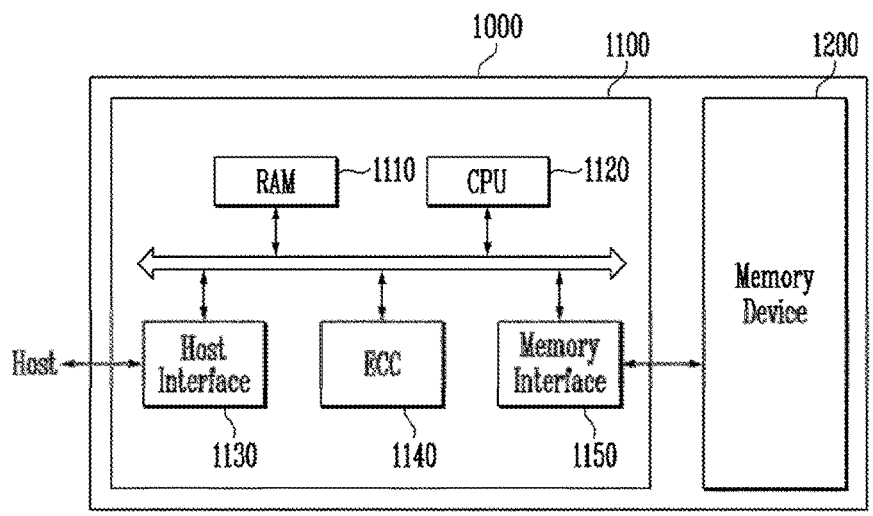
FIGS. 5 and 6 are diagrams illustrating example configurations of memory systems according to embodiments of the present disclosure.

FIG. 5 is a block diagram illustrating an example configuration of a memory system according to an embodiment of the present disclosure.

Referring to FIG. 5, the memory system 1000 according to an embodiment of the present disclosure may include a memory device 1200 and a controller 1100.

The memory device 1200 may be used to store data information having various data formats such as texts, graphics, and software codes. The memory device 1200 may be a nonvolatile memory, and may include the structures described with reference to FIGS. 1A to 4. In addition, the memory device 1200 may include a source layer, a stack structure, a channel layer, a slit, and a source pick-up line. The source layer may include at least one groove in an upper surface thereof. The stack structure may be formed over the source layer. The channel layer may pass through the stack structure. The channel layer may be in contact with the source layer. The slit may pass through the stack structure. The slit may expose the groove of the source layer therethrough. The source pick-up line may be formed in the slit and the groove. The source pick-up line may be in contact with the source layer. The structure and manufacturing method of the memory device 1200 are the same as described above, and therefore any repetitive detailed descriptions thereof will be omitted.

The controller 1100 may be electrically connected to a host and the memory device 1200, and may access the memory device 1200 in response to a request from the host. For example, the controller 1100 may control reading, writing, erasing, and background operations of the memory device 1200.

The controller 1100 may include a random access memory (RAM) 1110, a central processing unit (CPU) 1120, a host interface 1130, an error correction code (ECC) circuit 1140, a memory interface 1150, and the like.

Here, the RAM 1110 may be used as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), etc.

The CPU 1120 may control overall operations of the controller 1100. For example, the CPU 1120 may operate firmware such as a flash translation layer (FTL) stored in the RAM 1110.

The host interface 1130 may interface with the host. For example, the controller 1100 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 may detect and correct an error included in data that is read from the memory device 1200, using an error correction code (ECC).

The memory interface 1150 may interface with the memory device 1200. For example, the memory interface 1150 may include an NAND interface or NOR interface.

For reference, the controller 1100 may further include a buffer memory (not illustrated) for temporarily storing data.

Here, the buffer memory may be used to temporarily store data transferred to an external device through the host interface 1130 or data transferred from the memory device 1200 through the memory interface 1150. The controller 1100 may further include a ROM that stores code data for interfacing with the host.

As described above, the memory system 1000 according to an embodiment of the present disclosure may include the memory device 1200 having a stable structure and improved characteristics, and thus it is possible to improve characteristics of the memory system 1000.

Figure 6:
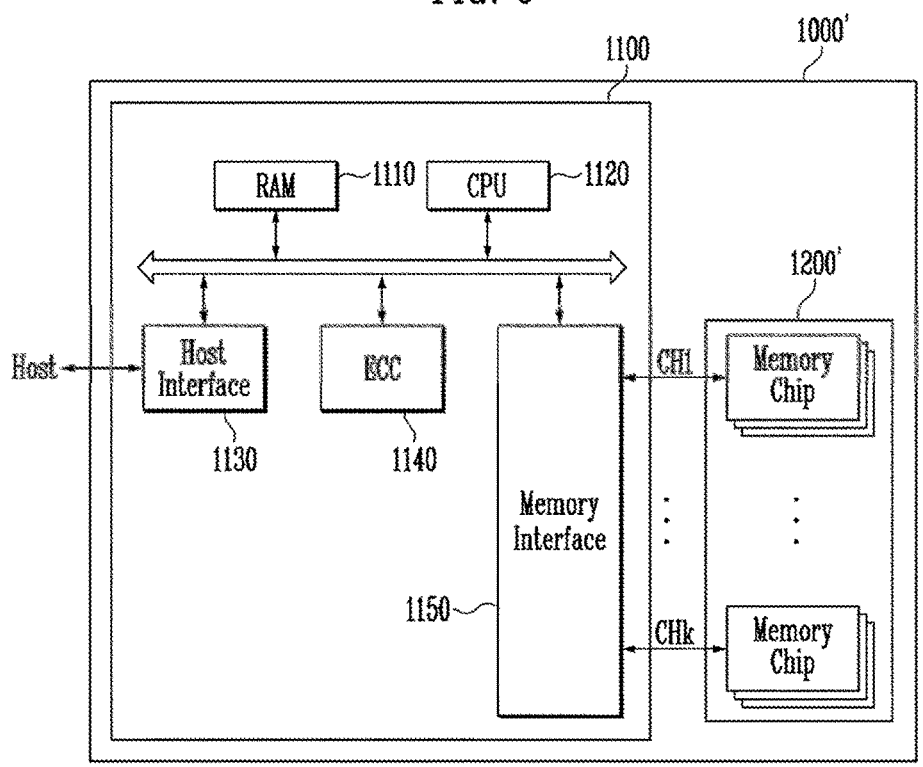

FIG. 6 is a block diagram illustrating an example configuration of a memory system according to an embodiment of the present disclosure. Hereinafter, any repetitive detailed description will be omitted or simplified.

In FIG. 6, the memory system 1000' according to an embodiment of the present disclosure may include a memory device 1200' and a controller 1100. The controller 1100 may include a RAM 1110, a CPU 1120, a host interface 1130, an ECC circuit 1140, a memory interface 1150, and the like.

The memory device 1200' may be a nonvolatile memory, and may include the structures described with reference to FIGS. 1A to 4. In addition, the memory device 1200' may include a source layer, a stack structure, a channel layer, a slit, and a source pick-up line. The source layer may include at least one groove in an upper surface thereof. The stack structure may be formed over the source layer. The channel layer may pass through the stack structure. The channel layer may be in contact with the source layer. The slit may pass through the stack structure. The slit may expose the groove of the source layer therethrough. The source pick-up line may be formed in the slit and the groove. The source pick-up line may be in contact with the source layer. The structure and manufacturing method of the memory device 1200' are the same as described above, and therefore any repetitive detailed descriptions thereof will be omitted.

The memory device 1200' may be a multi-chip package including a plurality of memory chips. The plurality of memory chips may be divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' according to an embodiment of the present disclosure may include the memory device 1200' having a stable structure and improved characteristics, and thus it is possible to improve characteristics of the memory system 1000'. Particularly, the memory device 1200' is configured as a multi-chip package, so that it is possible to increase the data storage capacity of the memory system 1000' and to improve the operation speed of the memory system 1000'.

Figure 7:
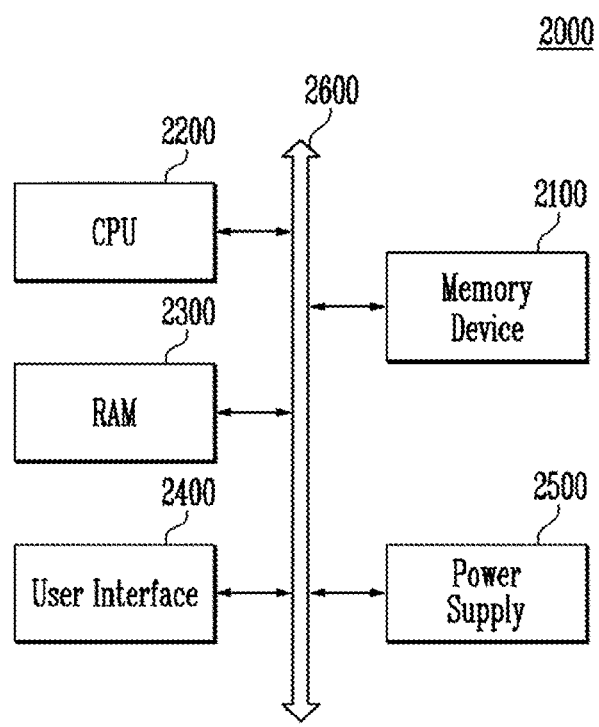
FIGS. 7 and 8 are diagrams illustrating example configurations of computing systems according to embodiments of the present disclosure.

FIG. 7 is a diagram illustrating an example configuration of a computing system according to an embodiment of the present disclosure. Hereinafter, any repetitive detailed description will be omitted or simplified.

In FIG. 7, the computing system 2000 according to an embodiment of the present disclosure may include a memory device 2100, a CPU 2200, a RAM 2300, a user interface 2400, a power source 2500, a system bus 2600, and the like.

The memory device 2100 may store data provided through the user interface 2400, data processed by the CPU 2200, and the like. In addition, the memory device 2100 may be electrically connected to the CPU 2200, the RAM 2300, the user interface 2400, the power source 2500, and the like through the system bus 2600. For example, the memory device 2100 may be electrically connected to the system bus 2600 through a controller (not illustrated) or directly. When the memory device 2100 is directly connected to the system bus 2600, a function of the controller may be performed by the CPU 2200, the RAM 2300, etc.

Here, the memory device 2100 may be a nonvolatile memory, and may include the structures described with reference to FIGS. 1A to 4. In addition, the memory device 2100 may include a source layer, a stack structure, a channel layer, a slit, and a source pick-up line. The source layer may include at least one groove in an upper surface thereof. The stack structure may be formed over the source layer. The channel layer may pass through the stack structure. The channel layer may be in contact with the source layer. The slit may pass through the stack structure. The slit may expose the groove of the source layer therethrough. The source pick-up line may be formed in the slit and the groove. The source pick-up line may be in contact with the source layer. The structure and manufacturing method of the memory device 2100 are the same as described above, and therefore any repetitive detailed descriptions thereof will be omitted.

The memory device 2100 may be a multi-chip package including a plurality of memory chips as described with reference to FIG. 6.

The computing system 2000 configured as described above may be a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 according to an embodiment of the present disclosure may include the memory device 2100 having a stable structure and improved characteristics, and thus it is possible to improve characteristics of the computing system 2000.

Figure 8:
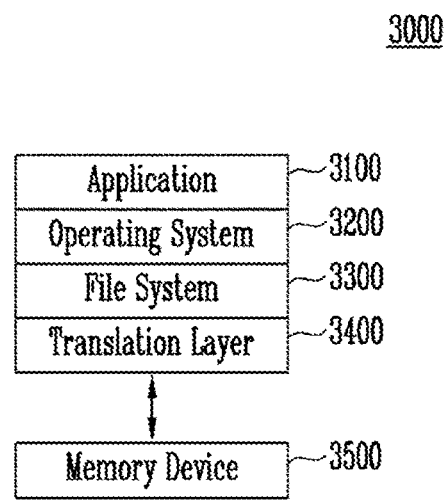

FIG. 8 is a diagram illustrating an example of a computing system according to an embodiment of the present disclosure.

In FIG. 8, the computing system 3000 according to an embodiment of the present disclosure may include a software layer including an operating system 3200, an application 3100, a file system 3300, a translation layer 3400, and the like. In addition, the computing system 3000 may include a hardware layer of a memory device 3500, etc.

The operating system 3200 may manage software resources, hardware resources, etc. of the computing system 3000, and control program execution of a central processing unit. The application 3100 may be one of a variety of application programs running on the computing system 3000, and may be a utility executed by the operating system 3200.

The file system 3300 may mean a logical structure for managing data, files, etc. in the computing system 3000, and may organize the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

Although the operating system 3200, the application 3100, and the file system 3300 are illustrated as being individual blocks, the application 3100 and the file system 3300 may be included in the operating system 3200.

The translation layer 3400 may translate an address into a form suitable for the memory device 3500 in response to a request from the file system 3300. For example, the translation layer 3400 may translate a logical address generated by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL), etc.

The memory device 3500 may be a nonvolatile memory, and may include the structures described with reference to FIGS. 1A to 4. In addition, the memory device 3500 may include a source layer, a stack structure, a channel layer, a slit, and a source pick-up line. The source layer may include at least one groove in an upper surface thereof. The stack structure may be formed over the source layer. The channel layer may pass through the stack structure. The channel layer may be in contact with the source layer. The slit may pass through the stack structure. The slit may expose the groove of the source layer therethrough. The source pick-up line may be formed in the slit and the groove. The source pick-up line may be in contact with the source layer. The structure and manufacturing method of the memory device 3500 are the same as described above, and therefore any repetitive detailed descriptions thereof will be omitted.

The computing system 3000 configured as described above may be divided into an operating system layer performed in an upper level region and a controller layer performed in a lower level region. Here, the application 3100, the operating system 3200, and the file system 3300 may be included in the operating system layer, and may be driven by the operation memory of the computing system 3000. In addition, the translation layer 3400 may be included in the operating system layer or the controller layer.

As described above, the computing system 3000 according to an embodiment of the present disclosure may include the memory device 3500 having a stable structure and improved characteristics, and thus it is possible to improve characteristics of the computing system 3000.

According to various embodiments of the present disclosure, it is possible to reduce difficulties in a manufacturing process of a semiconductor device and to improve characteristics of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
    a source layer including at least one groove in an upper surface thereof;
    a conductive pattern formed in the groove;
    a stack structure formed over the source layer and the conductive pattern, wherein the stack structure includes at least one lower select line, word lines and at least one upper select line;
    a channel layer passing through the stack structure, the channel layer being in contact with the source layer;
    a slit passing through the stack structure, the slit exposing the conductive pattern; and
    a source pick-up line formed in the slit, wherein the source pick-up line passes though the conductive pattern to contact the source layer.

2. The semiconductor device of claim 1, wherein the source pick-up line contains a metal.

3. The semiconductor device of claim 1, further comprising an insulating spacer formed on an inner wall of the slit.

4. The semiconductor device of claim 1, the source layer includes:
    a first source layer positioned in a cell region; and
    a second source layer formed on the first source layer, the second source layer including the groove.

5. The semiconductor device of claim 4, further comprising:
    a transistor positioned in a peripheral region, the transistor having a gate electrode formed of the same material as the first source layer.

6. The semiconductor device of claim 4, further comprising:
    a resistor pattern positioned in a peripheral region, the resistor pattern being positioned at the substantially same level as the second source layer.

7. The semiconductor device of claim 1, wherein the source pick-up line has a narrower width than the conductive pattern.

8. The semiconductor device of claim 1, wherein the slit has a narrower width than the groove.

9. The semiconductor device of claim 1, wherein the conductive pattern contains a metal.

10. The semiconductor device of claim 1, wherein an upper surface of the conductive pattern and the upper surface of the source layer are coplanar.

11. The semiconductor device of claim 1, further comprising:
    an oxide layer interposed between the conductive pattern and the source layer.

12. A semiconductor device comprising:
    a source layer including at least one groove in an upper surface thereof;
    a conductive pattern formed in the groove;
    a substrate under the source layer;
    a stack structure formed over the source layer and the conductive pattern, wherein the stack structure includes at least one lower select line, word lines and at least one upper select line;
    a source pick-up line passing through the stack structure and the conductive pattern to contact the source layer;
    a transistor having a gate electrode being positioned at the substantially same level as the source layer; and an insulating layer interposed between the substrate and the source layer and between the substrate and the gate electrode.

13. The semiconductor device of claim 12, wherein the source pick-up line has a narrower width than the conductive pattern.

14. The semiconductor device of claim 12, further comprising:
a channel layer passing through the stack structure, the channel layer being in contact with the source layer.

15. A semiconductor device comprising:
a source layer positioned in a cell region, the source layer including a first source layer and a second source layer formed on the first source layer, wherein the second source layer includes at least one groove in an upper surface thereof;
a conductive pattern formed in the groove;
a stack structure formed over the source layer and the conductive pattern, wherein the stack structure includes at least one lower select line, word lines and at least one upper select line;
a source pick-up line passing through the stack structure and the conductive pattern to contact the second source layer;
a transistor positioned in a peripheral region, the transistor having a gate electrode being positioned at the substantially same level as the first source layer; and
a resistor pattern positioned in the peripheral region, the resistor pattern being positioned at the substantially same level as the second source layer.

16. The semiconductor device of claim 15, wherein the gate electrode is formed of the same material as the first source layer.

17. The semiconductor device of claim 15, further comprising:
a substrate under the first source layer and including the cell region and the peripheral region;
an insulating layer interposed between the substrate and the first source layer in the cell region and between the substrate and the gate electrode in the peripheral region.

18. The semiconductor device of claim 15, wherein the resistor pattern is located over the transistor.

19. The semiconductor device of claim 15, further comprising:
a channel layer passing through the stack structure, the channel layer being in contact with the second source layer.

* * * * *